(12) United States Patent
Hongo et al.

(10) Patent No.: US 7,212,584 B2
(45) Date of Patent: May 1, 2007

(54) DISTORTION COMPENSATOR

(75) Inventors: Naoki Hongo, Tokyo (JP); Masaki Suto, Tokyo (JP); Toshio Takada, Tokyo (JP); Hidefumi Ito, Tokyo (JP); Shuhei Miura, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 748 days.

(21) Appl. No.: 10/624,652

(22) Filed: Jul. 23, 2003

(65) Prior Publication Data

US 2004/0120420 A1    Jun. 24, 2004

(30) Foreign Application Priority Data

Aug. 5, 2002   (JP)   ............... 2002-227638
Oct. 3, 2002   (JP)   ............... 2002-290722
Oct. 3, 2002   (JP)   ............... 2002-290723

(51) Int. Cl.
*H04K 1/02*    (2006.01)
*H04L 25/03*   (2006.01)

(52) U.S. Cl. ....................................... 375/297

(58) Field of Classification Search ............... 375/296, 375/297; 455/126, 341, 239.1; 330/149
See application file for complete search history.

(56) References Cited

U.S. PATENT DOCUMENTS 5,151,664 A    9/1992  Suematsu et al.
5,900,778 A *  5/1999  Stonick et al. .............. 330/149
2002/0041209 A1* 4/2002 Miyatani ..................... 330/149
2002/0101938 A1* 8/2002 Horaguchi et al. ......... 375/297
2003/0207680 A1* 11/2003 Yang et al. .................. 455/341

FOREIGN PATENT DOCUMENTS

| JP | 1-260904  | 10/1989 |
| JP | 6-338744  | 12/1994 |
| JP | 7-264082  | 10/1995 |
| WO | 02/25808  | 3/2002  |

* cited by examiner

*Primary Examiner*—Don N. Vo
(74) *Attorney, Agent, or Firm*—Wenderoth, Lind & Ponack, L.L.P.

(57) ABSTRACT

A distortion compensator compensates for distortion arising in an amplifier that amplifies a signal with improved efficiency. The distortion compensator includes a signal level detector which detects the level of a signal to be amplified by an amplifier, a distortion compensation execution unit which executes distortion compensation on the signal to be amplified according to a mode of distortion compensation corresponding to the signal level detected by the signal level and a correspondence between signal levels and distortion compensation control values as pairs, a distortion compensation control value correspondence updater which updates the correspondence between the signal levels and the distortion compensation control values used in the execution of distortion compensation, and a distortion compensation control value number controller which controls the values of stipulated parameters.

16 Claims, 16 Drawing Sheets

| Range of the distortion amount (or error signal) E | Number of interpolation points | Magnitude of E | Number of points in A |
|---|---|---|---|
| Th1 < E | A1 | Large | Small |
| Th2 < E ≦ Th1 | A2 | | |
| ⋮ | ⋮ | | |
| Th(N-1) < E ≦ Th(N-2) | A(N-1) | ↓ | ↓ |
| 0 ≦ E ≦ Th(N-1) | A(N) | Small | Large |

Fig.3

(a) Case in which the number of interpolation points is small (e.g., a table in the midst of convergence)

(b) Case in which the number of interpolation points is large (e.g., an optimized table)

Threshold values for the distortion amount (or error signal) $Th_1 > Th_2 > ... > Th_{(N-2)} > Th_{(N-1)}$

| Range of the time t from the start of convergance | Number of interpolation points | Magnitude of t | Number of points in A |
|---|---|---|---|
| $0 < t \leq T1$ | A1 | Small | Small |
| $T1 < t \leq T2$ | A2 | ↓ | ↓ |
| ⋮ | ⋮ | | |
| $T(N-2) < t \leq T(N-1)$ | A(N-1) | ↓ | ↓ |
| $T(N-1) < t$ | A(N) | Large | Large |

Fig.9

Threshold values for time from the start of convergence: $T_1 < T_2 < ... < T_{(N-2)} < T_{(N-1)}$

| Range of the distortion amount (or error signal) E | Interpolation point updata amount | Magnitude of E | Magnitude of the Interpolation point updata amount (A) |
|---|---|---|---|
| Th1 < E | A1 | Large | Large |
| Th2 < E ≦ Th1 | A2 | ↓ | ↓ |
| ⋮ | ⋮ | | |
| Th(N-1) < E ≦ Th(N-2) | A(N-1) | ↓ | ↓ |
| 0 ≦ E ≦ Th(N-1) | A(N) | Small | Small |

Fig.12

| Range of the time t from the start of convergence | Interpolation point updata amount | Magnitude of t | Magnitude of the Interpolation point updata amount (A) |
|---|---|---|---|
| $0 < t \leq T1$ | A1 | Small ↓ Large | Large ↓ Small |
| $T1 < t \leq T2$ | A2 | | |
| ⋮ | ⋮ | | |
| $T(N-2) < t \leq T(N-1)$ | A(N-1) | | |
| $T(N-1) < t$ | A(N) | | |

Fig.14

| Range of the distortion amount (or error signal) E | Interpolation point updata frequency | Magnitude of E | Magnitude of the interpolation point updata frequency (A) |
|---|---|---|---|
| Th1 < E | A1 | Large ↓ Small | High ↓ Low |
| Th2 < E ≦ Th1 | A2 | | |
| ⋮ | ⋮ | | |
| Th(N-1) < E ≦ Th(N-2) | A(N-1) | | |
| 0 ≦ E ≦ Th(N-1) | A(N) | | |

Fig.15

| Range of the time t from the start of convergence | Interpolation point updata amount | Magnitude of t | Magnitude of the interpolation point updata frequency (A) |
|---|---|---|---|
| $0 < t \leq T1$ | A1 | Small | High |
| $T1 < t \leq T2$ | A2 | ↓ | ↓ |
| ⋮ | ⋮ | | |
| $T(N-2) < t \leq T(N-1)$ | A(N-1) | ↓ | ↓ |
| $T(N-1) < t$ | A(N) | Large | Low |

Fig.16

DISTORTION COMPENSATOR

BACKGROUND OF THE INVENTION

1. Field of the Invention

This invention relates to a distortion compensator that compensates for distortion arising in an amplifier that amplifies signals, and particularly to a distortion compensator that, in a configuration whereby distortion compensation is performed based on the correspondence between signal levels and distortion compensation control values that determine the mode of distortion compensation, is intended to improve the efficiency of distortion compensation by controlling the number of pairs of corresponding signal levels and distortion compensation control values, controlling the amount by which the correspondence between signal levels and distortion compensation control values is updated, and controlling the frequency at which the correspondence between signal levels and distortion compensation control values is updated.

2. Description of the Prior Art

In a base station unit provided in a mobile communications system that adopts wideband-code division multiple access (W-CDMA) as the mobile communications protocol, it is necessary that the wireless signals reach multiple mobile station units that are physically far apart, so amplifiers must be used to greatly amplify the signals to be transmitted before transmission.

However, amplifiers are analog devices, so their input/output characteristics are nonlinear functions. In particular, after the amplification limit called the saturation point, the output power becomes nearly constant even if the power input to the amplifier is increased further, so this nonlinear output gives rise to nonlinear distortion.

In the transmit signal prior to amplification, signal components outside of the desired signal band are kept to low levels by bandlimiting filters, but in the signal after passing through the filter, nonlinear distortion occurs so signal components may leak to adjacent channels or other areas outside the desired signal band. For example, in a base station unit, the transmission power is large as described above, so the magnitude of this leakage of power to adjacent channels is strictly regulated, so techniques of decreasing this adjacent channel leak power (ACP) are used.

An example of a technique of decreasing the adjacent channel leak power is the use of a predistorter.

Based on a distortion compensation table containing input signal levels and the corresponding distortion compensation control values, a predistorter generates distortion that will cancel the distortion generated in the amplifier with respect to the signal amplified by the amplifier, thus compensating for the distortion generated in the amplifier and decreasing the adjacent channel leak power.

In recent years, the adaptive predistortion (APD) method in which the contents of the distortion compensation table are adaptively controlled is attracting attention as an example of a distortion compensation scheme for implementing a highly efficient amplifier, so adaptive predistorters that perform such control are attracting attention.

Here follows a description of background art on distortion compensation.

With the "Linearizer" recited in the present inventors' publication of unexamined Japanese patent application (Kokai) No. JP-A-2001-368150 (Reference Document 1), the scope of variation of the input signal to the power amplifier is divided into a plurality of divisions, the points indicating the input signal level of each division are taken to be representative points, the inverse characteristic of the nonlinearity of the power amplifier is calculated for only the representative points and a coefficient of distortion compensation is found, and then the coefficient of distortion compensation for the representative points is used for interpolation and inverse interpolation to find a coefficient of distortion compensation for other points of the input signal level. In addition, this Reference Document 1 also recites interpolation performed using Lagrange interpolation polynomials, improving the accuracy of interpolation by increasing the order of such interpolation polynomials and also improving the accuracy of interpolation by making smaller the intervals between the representative points of the input signal level.

With the "Predistortion-Type Nonlinear Distortion Compensation Circuit and Digital Transmitter Using Same" recited in Kokai No. JP-A-2001-284980 (Reference Document 2), interpolation or extrapolation are performed using proportional calculation, and when the distortion compensation value table is updated a stipulated number of times, distortion compensation values that had never been updated are updated by interpolation. Specifically, assuming that $p_1 < p_2$, if $(p_1, q_1)$ and $(p_2, q_2)$ are known then interpolation to calculate $(p, q)$ with respect to $p$ such that $p_1 < p < p_2$, and extrapolation to calculate $(p, q)$ with respect to $p$ such that $p < p_1 < p_2$ and $p_1 < p_2 < p$ are performed.

With the "Signal Distortion Compensator and Distortion Compensation Method" recited in Kokai No. JP-A-2002-111401 (Reference Document 3), the coefficient of distortion compensation is updated based on the input signal and signal amplified by the amplifier. Specifically, the least mean squares (LMS) algorithm and the clipped least mean squares algorithm are used to update the coefficient of distortion compensation. In addition, the value of the step size of the clipped least mean squares algorithm is controlled and the dynamic range of the analog to digital (A/D) converter is controlled.

With the "Nonlinear Distortion-Compensated Power Amplifier" recited in Kokai No. JP-A-2001-203539 (Reference Document 4), the content of the table containing the input signal power values to the power amplifier and the corresponding distortion compensation coefficients (control coefficient values) is updated.

With the "Distortion Compensation Circuit" recited in Kokai No. JP-A-11-136302 (Reference Document 5), the gain deviation and orthogonal error of the quadrature modulator that causes deterioration of the accuracy of distortion compensation are compensated.

However, with a conventional predistorter, although the content of the distortion compensation table is updated, further improvement in efficiency is desirable. Specifically, with a conventional predistorter, when the content of the distortion compensation table is updated, it is desirable to improve the speed of convergence of the distortion compensation table, improve the accuracy of the content of the distortion compensation table and achieve lower power consumption.

The present invention came about in light of these conventional circumstances and has as its object to provide a distortion compensator that is able to improve the efficiency of distortion compensation at the time of compensating for the distortion arising in an amplifier based on the correspondence between signal levels and distortion compensation control values that determines the mode of distortion compensation. Specifically, with the present invention, when the correspondence between signal levels and distortion compensation control values is updated, it is possible to improve the speed of convergence of the distortion compensation table, improve the accuracy of the content of the distortion compensation table and achieve lower power consumption.

Note that in comparison to the present invention to be described later, with the background art presented in Reference Documents 1–5 above, there is no recitation or suggestion of adaptive control of the number of distortion compensation control values which is performed in the present invention, of adaptive control of the amount by which the correspondence between signal levels and distortion compensation control values is updated which is performed in the present invention, or of adaptive control of the frequency at which the correspondence between signal levels and distortion compensation control values is updated.

SUMMARY OF THE INVENTION

The distortion compensator according to the present invention is a distortion compensator that compensates for distortion arising in an amplifier that amplifies a signal, including: signal level detection means that detects the level of the signal amplified by the amplifier, distortion compensation execution means that executes distortion compensation with respect to the signal amplified by the amplifier by a mode of distortion compensation corresponding to the signal level detected by the signal level detection means based on the correspondence between signal levels and distortion compensation control values that determine the mode of distortion compensation, distortion compensation control value correspondence update means that updates the correspondence between signal levels and distortion compensation control values used in the execution of distortion compensation by the distortion compensation execution means based on the signal amplified by the amplifier, and distortion compensation control value correspondence updating mode parameter value control means that controls the values of stipulated parameters (objects of control) regarding the mode of updating by the distortion compensation control value correspondence update means.

In the following, according to a first aspect of the present invention, to represent the values of stipulated parameters pertaining to the mode of updating by the distortion compensation control value correspondence update means, the number of pairs of corresponding signal levels and distortion compensation control values in the correspondence between signal levels and distortion compensation control values updated by the distortion compensation control value correspondence update means is used.

In addition, according to a second aspect of the present invention, to represent the values of stipulated parameters pertaining to the mode of updating by the distortion compensation control value correspondence update means, the amount by which the correspondence between signal levels and distortion compensation control values is updated by the distortion compensation control value correspondence update means is used.

In addition, as a third aspect of the present invention, to represent the values of stipulated parameters pertaining to the mode of updating by the distortion compensation control value correspondence update means, the frequency at which the correspondence between signal levels and distortion compensation control values is updated by the distortion compensation control value correspondence update means is used.

In order to achieve the aforementioned objects, the distortion compensator according to the first aspect of the present invention compensates for distortion arising in an amplifier that amplifies a signal as described below.

To wit, the signal level detection means detects the level of the signal amplified by the amplifier, the distortion compensation execution means executes distortion compensation with respect to the signal amplified by the amplifier by a mode of distortion compensation corresponding to the signal level detected by the signal level detection means based on the correspondence between signal levels and distortion compensation control values that determine the mode of distortion compensation.

In addition, the distortion compensation control value correspondence update means updates the correspondence between signal levels and distortion compensation control values used in the execution of distortion compensation by the distortion compensation execution means based on the signal amplified by the amplifier, and the distortion compensation control value number control means controls the number of pairs of corresponding signal levels and distortion compensation control values in the correspondence between signal levels and distortion compensation control values updated by the distortion compensation control value correspondence update means.

Accordingly, when updating the correspondence between signal levels and distortion compensation control values that determine the mode of distortion compensation, it is possible to improve the efficiency of distortion compensation by controlling the number of pairs of corresponding signal levels and distortion compensation control values. Specifically, as a general trend, if the number of pairs is decreased, the accuracy of distortion compensation may not be very high but it is possible to decrease the burden of this updating process and also increase the speed of this updating process, but conversely if the number of pairs is increased, the burden of this updating process may not be very small, but it is possible to increase the accuracy of distortion compensation.

In order to achieve the aforementioned objects, the distortion compensator according to the second aspect of the present invention compensates for distortion arising in an amplifier that amplifies a signal as described below.

To wit, the signal level detection means detects the level of the signal amplified by the amplifier, the distortion compensation execution means executes distortion compensation with respect to the signal amplified by the amplifier by a mode of distortion compensation corresponding to the signal level detected by the signal level detection means based on the correspondence between signal levels and distortion compensation control values that determine the mode of distortion compensation.

In addition, the distortion compensation control value correspondence update means updates the correspondence between signal levels and distortion compensation control values used in the execution of distortion compensation by the distortion compensation execution means based on the signal amplified by the amplifier, and the update amount control means controls the amount by which the correspondence between signal levels and distortion compensation control values is updated by the distortion compensation control value correspondence update means.

Accordingly, when updating the correspondence between signal levels and distortion compensation control values that determine the mode of distortion compensation, it is possible to improve the efficiency of distortion compensation by controlling the amount by which the correspondence between signal levels and distortion compensation control values is updated. Specifically, as a general trend, if the amount of updating is increased, the accuracy of distortion compensation may not be very high but it is possible to increase the speed of this updating process, but conversely if the amount of updating is decreased, it is possible to increase the accuracy of distortion compensation.

In order to achieve the aforementioned objects, the distortion compensator according to the third aspect of the present invention compensates for distortion arising in an amplifier that amplifies a signal as described below.

To wit, the signal level detection means detects the level of the signal amplified by the amplifier, the distortion compensation execution means executes distortion compensation with respect to the signal amplified by the amplifier by a mode of distortion compensation corresponding to the signal level detected by the signal level detection means based on the correspondence between signal levels and distortion compensation control values that determine the mode of distortion compensation.

In addition, the distortion compensation control value correspondence update means updates the correspondence between signal levels and distortion compensation control values used in the execution of distortion compensation by the distortion compensation execution means based on the signal amplified by the amplifier, and the update frequency control means controls the frequency at which the correspondence between signal levels and distortion compensation control values is updated by the distortion compensation control value correspondence update means.

Accordingly, when updating the correspondence between signal levels and distortion compensation control values that determine the mode of distortion compensation, it is possible to improve the efficiency of distortion compensation by controlling the frequency at which the correspondence between signal levels and distortion compensation control values is updated. Specifically, as a general trend, if the update frequency is increased, it is possible to increase the speed of this updating process, but conversely if the update frequency is decreased, it is possible to lower power consumption.

Here, various signals may be used as the signal amplified by the amplifier.

In addition, various types of amplifiers may be used as the amplifier. For example, one amplifier may be used or a combination of a plurality of amplifiers may also be used.

In addition, as the accuracy of compensating for the distortion arising in the amplifier, various types of accuracy may be used as long as they are effective in practice.

In addition, various levels such as the power level or amplification level may be used as the signal level.

In addition, various modes may be used as the mode of distortion compensation. For example, modes of executing distortion compensation may be used.

In addition, to represent the distortion compensation control value, information that determines the mode of distortion compensation may be used, and specifically information that directly indicates the mode of distortion compensation, or information that is able to determine the mode of distortion compensation or the like may be used. In addition, various items may be used to represent the content of the correspondence between signal levels and distortion compensation control values. For example, a mode in which the correspondence is stored in memory or other storage means until it is next updated may be used, or a mode in which the correspondence is kept temporarily for only the time required may be used. As another example, it is possible to use a mode wherein a plurality of these signal levels corresponds to the respective distortion compensation control values may be used. In this case, the value of a representative level within a range of levels that the level of the signal amplified by the amplifier may take can be used as the plurality of signal levels. In addition, levels spaced at equal intervals within this stipulated range of levels can be used as the representative level. In addition, a fixed range or a variable range may be used as this stipulated range of levels.

In addition, to represent the mode of distortion compensation corresponding to the signal level detected by the signal level detection means a mode determined based on a distortion compensation control value corresponding to a signal level that agrees with this detected signal level within the signal levels corresponding to distortion compensation control values may be used, or a mode determined based on a distortion compensation control value corresponding to the signal level closest to this detected signal level within the signal levels corresponding to distortion compensation control values may be used, or a mode determined by performing interpolation based on a distortion compensation control value corresponding to a signal level that agrees with or a signal level that does not agree with this detected signal level within the signal levels corresponding to distortion compensation control values may be used.

In addition, a process that generates distortion in the signal amplified by the amplifier that is able to decrease or cancel to zero the distortion arising in the amplifier may be used as the process of distortion compensation for the signal amplified by the amplifier.

In addition, a portion of the signal amplified by the amplifier used to update the correspondence between signal levels and distortion compensation control values may be used to perform the feedback-based updating process.

In addition, various modes may be used as the mode of updating the correspondence between signal levels and distortion compensation control values, or a combination of various modes may be used. For example, a mode wherein only the distortion compensation value is updated, or a mode wherein both the signal level and the distortion compensation control value are updated may be used.

In addition, in the first aspect of the present invention, various modes may be used as the mode of controlling the number of pairs of corresponding signal levels and distortion compensation control values in the correspondence between signal levels and distortion compensation control values. For example, a mode in which the situation of this updating of the correspondence may be used.

In addition, in the second aspect of the present invention, various modes may be used as the mode of controlling the amount by which the correspondence between signal levels and distortion compensation control values is updated. For example, a mode in which control is performed depending on the situation of this updating of the correspondence may be used.

Specifically, the distortion compensation control value correspondence update means updates the correspondence between signal levels and distortion compensation control values by an amount of updating controlled by the updating amount control means.

In addition, as this amount of updating, the degree of change between the correspondence between signal level and distortion compensation control values prior to this updating and the correspondence between signal levels and distortion compensation control values after this updating may be used.

In addition, various amounts may be used as this degree of change. For example, the amount of change in the individual distortion compensation control values, the amount of change in the individual signal levels, the amount of change in the overall signal level, the amount of change in the number of pairs of corresponding signal levels and distortion compensation control values, or a combination of these may be used.

In addition, in the third aspect of the present invention, various modes may be used as the mode of controlling the frequency at which the correspondence between signal levels and distortion compensation control values is updated. For example, a mode in which control is performed depending on the situation of this updating of the correspondence may be used.

Specifically, the distortion compensation control value correspondence update means updates the correspondence between signal levels and distortion compensation control values on timing based on the update frequency controlled by the updating amount control means.

Note that if the update frequency is low, then the number of times the updating is performed within the same amount of time is less than when the update frequency is high.

In addition, as an example of a configuration of a distortion compensator according to the first, second or third aspect of the present invention, the distortion compensation execution means has a distortion compensation control value interpolation means as follows.

To wit, the distortion compensation control value interpolation means performs interpolation based on a plurality of pairs of corresponding signal levels and distortion compensation control values in the correspondence between signal levels and distortion compensation control values, thereby determining the mode of distortion compensation corresponding to the signal level detected by the signal level detection means.

Accordingly even in the case in which a signal of a signal level that is not determined by the correspondence between signal level and distortion compensation control values is input to the amplifier, by performing interpolation based on the content determined by this correspondence, it is possible to determine the mode of distortion compensation for this signal of a signal level that is not determined. By using such interpolation it is possible to determine the mode of distortion compensation with relatively good accuracy with respect to a larger number of pairs of signal levels and distortion compensation control value than those calculated in this updating of the correspondence. In addition, it is possible to decrease the burden of this calculation and decrease the storage capacity required to store the correspondence when it is stored.

Here, various types of interpolation may be used as the type of interpolation. For example, interpolation or extrapolation may be used.

In addition, various modes may be used as the mode of performing interpolation. For example, a mode of performing interpolation using a proportional relationship or a mode of performing interpolation using a second-order or higher-order function can be used.

In addition, various numbers may be used as the number of pairs of signal levels and distortion compensation control values used to perform interpolation.

For example, to represent the correspondence between the mode of distortion compensation and signal level obtained by interpolation a mode in which the results of this interpolation are stored in memory or other storage means may be used, or a mode in which the results are kept temporarily for only the time required may be used.

In addition, a mode wherein the pairs of corresponding distortion compensation control values and signal levels based on the correspondence between signal levels and distortion compensation control values used to perform this interpolation are reflected in the content of correspondence between signal levels and distortion compensation control values may be used.

To wit, in the first aspect of the present invention, a mode wherein the pairs of corresponding distortion compensation control values and signal levels obtained based on the results of interpolation are reflected in the content of correspondence between signal levels and distortion compensation control values may be used.

As an example of a configuration of a distortion compensator according to the first aspect of the present invention, the distortion compensation control value number control means increases the number of pairs of corresponding signal levels and distortion compensation control values in the correspondence between signal levels and distortion compensation control values updated by the distortion compensation control value correspondence update means together with a decrease in the distortion components generated in the amplifier contained in the signal amplified by the amplifier. In addition, the distortion compensation control value number control means decreases the number of pairs of corresponding signal levels and distortion compensation control values in the correspondence between signal levels and distortion compensation control values updated by the distortion compensation control value correspondence update means together with an increase in the distortion components generated in the amplifier contained in the signal amplified by the amplifier.

Accordingly, as the distortion components contained in the signal amplified by the amplifier become smaller, (i.e., as the components of distortion that are not compensated for by distortion compensation and remain in the signal after amplification, that is, remaining distortion components, become smaller), the number of pairs of corresponding signal levels and distortion compensation control values is increased. Thus, when the remaining distortion components are large the accuracy of distortion compensation is not very high but the load of the updating process becomes small and the speed of the updating process can be increased. On the other hand, as these residual distortion components become larger, the number of these pairs is made relatively large and the accuracy of distortion compensation can be increased. Thereby, at the time of updating the correspondence between signal levels and distortion compensation control values, it is possible to increase the speed of convergence of this updating and increase the accuracy of the content of the correspondence thus updated.

In addition, as the distortion components contained in the signal amplified by the amplifier become larger (i.e., as the components of distortion that are not compensated for by distortion compensation and remain in the signal after amplification, that is, remaining distortion components, become larger), the number of pairs of corresponding signal levels and distortion compensation control values is decreased. For this reason at the time of updating the correspondence between signal levels and distortion compensation control values, when the remaining distortion components become large in the process of its convergence, the updating process can be performed with the number of these pairs decreased further.

For example, a portion of the signal amplified by the amplifier used to control the number of pairs of corresponding signal levels and distortion compensation control values may be used to perform the feedback-based updating process.

In addition, to represent the magnitude of the distortion components arising in the amplifier and contained in the signal amplified by the amplifier the magnitude of the distortion detected from this amplified signal may be used, or the magnitude of the error from the true signal regarding this amplified signal is proportional to the magnitude of the distortion may be used. Note that this true signal is defined to be the signal amplified by the amplifier, and may be the signal prior to distortion being generated by the distortion compensation execution means (namely, the input signal).

In addition, various modes may be used as the mode of increasing the number of pairs of corresponding signal levels and distortion compensation control values as the distortion components arising in the amplifier and contained in the signal amplified by the amplifier become smaller. For example, it is possible to set one or two or more threshold values pertaining to the magnitude of these distortion components, and the number of these sets are increased in a stepwise fashion as the magnitude of these distortion components becomes greater than or equal to the threshold value or greater than the threshold value.

In addition, a mode in which the interval between the plurality of signal levels set in the correspondence between signal levels and distortion compensation control values is made smaller is used as the mode of increasing the number of pairs of corresponding signal levels and distortion compensation control values, and in this mode, it is possible to increase the accuracy of distortion compensation by making this interval small.

In addition, various modes may be used as the mode of decreasing the number of pairs of corresponding signal levels and distortion compensation control values as the distortion components arising in the amplifier and contained in the signal amplified by the amplifier become larger.

As an example of a configuration of a distortion compensator according to the second aspect of the present invention, the updating amount control means decreases the amount by which the correspondence between signal levels and distortion compensation control values is updated by the distortion compensation control value correspondence update means together with a decrease in the distortion components generated in the amplifier contained in the signal amplified by the amplifier. In addition, the updating amount control means increases the amount by which the correspondence between signal levels and distortion compensation control values is updated by the distortion compensation control value correspondence update means together with an increase in the distortion components generated in the amplifier contained in the signal amplified by the amplifier.

Accordingly, as the distortion components contained in the signal amplified by the amplifier become smaller (i.e., as the components of distortion that are not compensated for by distortion compensation and remain in the signal after amplification, that is, remaining distortion components, become smaller), the amount by which the correspondence between signal levels and distortion compensation control values is updated is decreased. Thus, when the remaining distortion components are large the accuracy of distortion compensation is not very high but the speed of the updating process is increased. On the other hand, as these residual distortion components become larger, the amount of updating is made relatively small and the accuracy of distortion compensation can be increased. Thereby, at the time of updating the correspondence between signal levels and distortion compensation control values, it is possible to increase the speed of convergence of this updating and increase the accuracy of the content of the correspondence thus updated.

In addition, as the distortion components, contained in the signal amplified by the amplifier, become larger (i.e., as the components of distortion that are not compensated for by distortion compensation and remain in the signal after amplification, that is, remaining distortion components, become larger), the amount by which the correspondence between signal levels and distortion compensation control values is updated is increased. For this reason, at the time of updating the correspondence between signal levels and distortion compensation control values, when the remaining distortion components become large in the process of its convergence, the updating process can be performed with the amount of updating increased further.

Here, a portion of the signal amplified by the amplifier used to control the amount by which the correspondence between signal levels and distortion compensation control values is updated may be used to perform the feedback-based updating process.

In addition, to represent the magnitude of the distortion components arising in the amplifier and contained in the signal amplified by the amplifier the magnitude of the distortion detected from this amplified signal may be used, or the magnitude of the error from the true signal regarding this amplified signal is proportional to the magnitude of the distortion may be used. Note that this true signal is defined to be the signal amplified by the amplifier, and may be the signal prior to distortion being generated by the distortion compensation execution means (i.e., the input signal).

In addition, various modes may be used as the mode of decreasing the amount by which the correspondence between signal levels and distortion compensation control values is updated as the distortion components arising in the amplifier and contained in the signal amplified by the amplifier become smaller. For example, it is possible to set one or two or more threshold values pertaining to the magnitude of these distortion components, and this amount of updating is decreased in a stepwise fashion as the magnitude of these distortion components becomes equal to or less than the threshold value or less than the threshold value.

In addition, various modes may be used as the mode of increasing the amount by which the correspondence between signal levels and distortion compensation control values is updated as the distortion components arising in the amplifier and contained in the signal amplified by the amplifier become larger.

As an example of a configuration of a distortion compensator according to the third aspect of the present invention, the updating frequency control means decreases the frequency at which the correspondence between signal levels and distortion compensation control values is updated by the distortion compensation control value correspondence update means together with a decrease in the distortion components generated in the amplifier contained in the signal amplified by the amplifier. In addition, the updating frequency control means increases the frequency at which the correspondence between signal level and distortion compensation control values is updated by the distortion compensation control value correspondence update means together with an increase in the distortion components generated in the amplifier contained in the signal amplified by the amplifier.

Accordingly, as the distortion components contained in the signal amplified by the amplifier become smaller (i.e., as the components of distortion that are not compensated for by distortion compensation and remain in the signal after amplification, that is, remaining distortion components, become smaller), the frequency at which the correspondence between signal levels and distortion compensation control values is updated is decreased. Thus, when the remaining distortion components are large the speed of the updating process is increased. On the other hand, as these residual distortion components become larger, the power consumption can be made relatively low. Thereby, at the time of updating the correspondence between signal levels and distortion compensation control values, it is possible to increase the speed of convergence of this updating and lower the power consumption.

In addition, as the distortion components contained in the signal amplified by the amplifier become larger (i.e., as the components of distortion that are not compensated for by distortion compensation and remain in the signal after amplification, that is, remaining distortion components, become larger), the frequency at which the correspondence between signal levels and distortion compensation control values is updated is increased. For this reason at the time of updating the correspondence between signal levels and distortion compensation control values, when the remaining distortion components become large in the process of its convergence, the updating process can be performed with the update frequency increased further.

Here, a portion of the signal amplified by the amplifier used to control the frequency at which the correspondence between signal levels and distortion compensation control values which is updated may be used to perform the feedback-based updating process.

In addition, to represent the magnitude of the distortion components arising in the amplifier and contained in the signal amplified by the amplifier the magnitude of the distortion detected from this amplified signal may be used, or one in which the magnitude of the error from the true signal regarding this amplified signal is proportional to the magnitude of the distortion may be used. Note that this true signal is defined to be the signal amplified by the amplifier, and may be the signal prior to distortion being generated by the distortion compensation execution means (namely, the input signal).

In addition, various modes may be used as the mode of decreasing the frequency at which the correspondence between signal levels and distortion compensation control values is updated as the distortion components arising in the amplifier and contained in the signal amplified by the amplifier become smaller. For example, it is possible to set one or two or more threshold values pertaining to the magnitude of these distortion components, and this update frequency is decreased in a stepwise fashion as the magnitude of these distortion components becomes equal to or less than the threshold value or less than the threshold value.

In addition, various modes may be used as the mode of increasing the frequency at which the correspondence between signal levels and distortion compensation control values is updated as the distortion components arising in the amplifier and contained in the signal amplified by the amplifier become larger.

As an example of a configuration of a distortion compensator according to the first aspect of the present invention, the distortion compensation control value number control means has an elapsed time measurement means that measures the elapsed time in the processing of the signal subject to amplification by the amplifier. Moreover, the distortion compensation control value number control means increases the number of pairs of corresponding signal levels and distortion compensation control values in the correspondence between signal levels and distortion compensation control values updated by the distortion compensation control value correspondence update means together with an increase in the elapsed time measured by the elapsed time measurement means.

Accordingly, as the elapsed time in the processing of signals subject to amplification by the amplifier becomes larger (i.e., as the accuracy of distortion compensation is improved and the components of distortion that are not compensated for by this distortion compensation and remain in the signal after amplification, that is, remaining distortion components, are assumed to become smaller with the elapsed time), the number of pairs of corresponding signal levels and distortion compensation control values is increased. Thus, when this elapsed time is small the accuracy of distortion compensation is not very high but the load of the updating process becomes small and the speed of the updating process can be increased. On the other hand, as this elapsed time becomes larger, the number of these pairs is made relatively large and the accuracy of distortion compensation can be increased. Thereby, at the time of updating the correspondence between signal levels and distortion compensation control values, it is possible to increase the speed of convergence of this updating and increase the accuracy of the content of the correspondence thus updated.

Here, the time measured starting from various points in time may be used as the elapsed time for the signal subject to amplification by the amplifier. For example, the time measured starting from such a point in time at which the accuracy of the distortion compensation is found to have been improved by updating the correspondence between signal levels and distortion compensation control values may be used. As an example, a mode wherein the point in time at which a series of signals subject to amplification by an amplifier is input is taken to be the zero point and the elapsed time is measured thereafter may be used.

In addition, various modes may be used as the mode of increasing the number of pairs of corresponding signal levels and distortion compensation control values as the elapsed time becomes larger. For example, it is possible to set one or two or more threshold values pertaining to the magnitude of this elapsed time, and the number of these sets are increased in a stepwise fashion as the magnitude of this elapsed time becomes greater than or equal to the threshold value or greater than the threshold value.

In addition, a mode in which the interval between the plurality of signal levels set in the correspondence between signal levels and distortion compensation control values is made smaller may be used as the mode of increasing the number of pairs of corresponding signal levels and distortion compensation control values. In this mode, it is possible to increase the accuracy of distortion compensation by making this interval small.

As an example of a configuration of a distortion compensator according to the second aspect of the present invention, the update amount control means has an elapsed time measurement means that measures the elapsed time in the processing of the signal subject to amplification by the amplifier. Moreover, the update amount control means decreases the amount by which the correspondence between signal levels and distortion compensation control values is updated by the distortion compensation control value correspondence update means together with an increase in the elapsed time measured by the elapsed time measurement means.

Accordingly, as the elapsed time in the processing of signals subject to amplification by the amplifier becomes larger (i.e., as the accuracy of distortion compensation is improved and the components of distortion that are not compensated for by this distortion compensation and remain in the signal after amplification, that is, remaining distortion components, are assumed to become smaller with the elapsed time), the amount by which the correspondence between signal levels and distortion compensation control values is updated is increased. Thus, when this elapsed time is small the accuracy of distortion compensation is not very high but the speed of the updating process can be increased. On the other hand, as this elapsed time becomes larger, the amount of updating is made relatively large and the accuracy of distortion compensation can be increased. Thereby at the time of updating the correspondence between signal levels and distortion compensation control values, it is possible to increase the speed of convergence of this updating and increase the accuracy of the content of the correspondence thus updated.

Here, the time measured starting from various points in time may be used as the elapsed time for the signal subject to amplification by the amplifier. For example, the time measured starting from such a point in time at which the accuracy of the distortion compensation is found to have been improved by updating the correspondence between signal levels and distortion compensation control values may be used. As an example, a mode wherein the point in time at which a series of signals subject to amplification by an amplifier is input is taken to be the zero point and the elapsed time is measured thereafter may be used.

In addition, various modes may be used as the mode of increasing the amount by which the correspondence between signal levels and distortion compensation control values is updated as the elapsed time becomes larger. For example, it is possible to set one or two or more threshold values pertaining to the magnitude of this elapsed time, and this amount of updating is increased in a stepwise fashion as the magnitude of this elapsed time becomes greater than or equal to the threshold value or greater than the threshold value.

As an example of a configuration of a distortion compensator according to the third aspect of the present invention, the update frequency control means has an elapsed time measurement means that measures the elapsed time in the processing of the signal subject to amplification by the amplifier. Moreover, the update frequency control means decreases the frequency at which the correspondence between signal levels and distortion compensation control values is updated by the distortion compensation control value correspondence update means together with an increase in the elapsed time measured by the elapsed time measurement means.

Accordingly, as the elapsed time in the processing of signals subject to amplification by the amplifier becomes larger (i.e., as the accuracy of distortion compensation is improved and the components of distortion that are not compensated for by this distortion compensation and remain in the signal after amplification, that is, remaining distortion components are assumed to become smaller with the elapsed time), the frequency at which the correspondence between signal levels and distortion compensation control values is updated is increased. Thus, when this elapsed time is small the speed of the updating process can be increased. On the other hand, as this elapsed time becomes larger, the update frequency is made relatively low so the power consumption can be lowered. Thereby at the time of updating the correspondence between signal levels and distortion compensation control values, it is possible to increase the speed of convergence of this updating and lower the power consumption.

Here, the time measured starting from various points in time may be used as the elapsed time for the signal subject to amplification by the amplifier. For example, the time measured starting from such a point in time at which the accuracy of the distortion compensation is found to have been improved by updating the correspondence between signal levels and distortion compensation control values may be used. As an example, a mode wherein the point in time at which a series of signals subject to amplification by an amplifier is input is taken to be the zero point and the elapsed time is measured thereafter may be used.

In addition, various modes may be used as the mode of decreasing the frequency at which the correspondence between signal levels and distortion compensation control values is updated as the elapsed time becomes larger. For example, it is possible to set one or two or more threshold values pertaining to the magnitude of this elapsed time, and this update frequency is decreased in a stepwise fashion as the magnitude of this elapsed time becomes greater than or equal to the threshold value or greater than the threshold value.

In addition, as an example of a configuration of a distortion compensator according to the first aspect of the present invention, the distortion compensation control value number control means controls the number of pairs of corresponding signal levels and distortion compensation control values in the correspondence between signal levels and distortion compensation control values updated by the distortion compensation control value correspondence update means based on a correspondence between the number of distortion compensation control values and stipulated conditions to a number of distortion compensation control values that corresponds to the conditions.

Accordingly, by identifying the number of distortion compensation control values corresponding to conditions based on the correspondence between the number of distortion compensation control values and the stipulated conditions, and controlling the number of pairs of corresponding signal levels and distortion compensation control values to this identified number of distortion compensation control values, it is possible to control this number of pairs.

Here, various conditions may be used as the stipulated conditions. For example, conditions pertaining to the magnitude of the distortion arising in the amplifier contained in the signal amplified by the amplifier, conditions pertaining to error from the true signal pertaining to the signal amplified by the amplifier, or conditions pertaining to the elapsed time in the processing of the signal subject to amplification by the amplifier may be used.

In addition, various items may be used as the content of the correspondence between the number of distortion compensation control values and the stipulated conditions.

In addition, the correspondence between the number of distortion compensation control values and the stipulated conditions may be determined in advance and stored as a table or the like in memory or other storage means.

In addition, as an example of a configuration of a distortion compensator according to the second aspect of the present invention, the update amount control means controls the amount by which the correspondence between signal levels and distortion compensation control values is updated by the distortion compensation control value correspondence update means based on a correspondence between the quantity of updating and stipulated conditions.

Accordingly, by identifying the amount of updating corresponding to conditions based on the correspondence between the amount of updating and the stipulated conditions, and controlling the amount by which the correspondence between signal levels and distortion compensation control values is updated to this identified amount of updating, it is possible to control this amount of updating the correspondence.

Here, various conditions may be used as the stipulated conditions. For example, conditions pertaining to the magnitude of the distortion arising in the amplifier contained in the signal amplified by the amplifier, conditions pertaining to error from the true signal pertaining to the signal amplified by the amplifier, or conditions pertaining to the elapsed time in the processing of the signal subject to amplification by the amplifier may be used.

In addition, various items may be used as the content of the correspondence between the amount of updating and the stipulated conditions.

In addition, the correspondence between the amount of updating and the stipulated conditions may be determined in advance and stored as a table or the like in memory or other storage means.

In addition, as an example of a configuration of a distortion compensator according to the third aspect of the present invention, the update frequency control means controls the frequency at which the correspondence between signal levels and distortion compensation control values is updated by the distortion compensation control value correspondence update means based on a correspondence between the update frequency and stipulated conditions.

Accordingly, by identifying the update frequency corresponding to conditions based on the correspondence between the update frequency and the stipulated conditions, and controlling the frequency at which the correspondence between signal levels and distortion compensation control values is updated to this identified update frequency, it is possible to control the update frequency of this correspondence.

Here, various conditions may be used as the stipulated conditions. For example, conditions pertaining to the magnitude of the distortion arising in the amplifier contained in the signal amplified by the amplifier, conditions pertaining to error from the true signal pertaining to the signal amplified by the amplifier, or conditions pertaining to the elapsed time in the processing of the signal subject to amplification by the amplifier may be used.

In addition, various items may be used as the content of the correspondence between the update frequency and the stipulated conditions.

In addition, the correspondence between the update frequency and the stipulated conditions may be determined in advance and stored as a table or the like in memory or other storage means.

Here follows a description of a further example of a configuration of a distortion compensator according to the first, second or third aspect of the present invention including those presented above.

As an example of a configuration of the distortion compensator according to the present invention, the distortion compensation control value correspondence update means updates the correspondence between signal levels and distortion compensation control values used in the execution of distortion compensation by the distortion compensation execution means so that the distortion components arising in the amplifier included in the signal amplified by the amplifier are decreased.

Here, various modes may be used as the mode of updating the correspondence between signal levels and distortion compensation control values so that the distortion components arising in the amplifier included in the signal amplified by the amplifier are decreased. For example, a mode of performing control so that these distortion components are minimized is preferably used.

As an example of a configuration of the distortion compensator according to the present invention, the distortion compensation execution means comprises a distortion compensation control value correspondence storage means and a distortion-compensating distortion generation means. Moreover, the distortion compensation control value correspondence storage means stores the correspondence between signal levels and distortion compensation control values, while the distortion-compensating distortion generation means generates distortion with respect to the signal amplified by the amplifier in a distortion compensation mode corresponding to the signal level detected by the signal level detection means based on the content stored in the distortion compensation control value correspondence storage means. In addition, the distortion compensation control value correspondence update means updates the correspondence between signal levels and distortion compensation control values stored in the distortion compensation control value correspondence storage means based on the signal amplified by the amplifier.

Here, distortion that is able to decrease or cancel to zero the distortion arising in the amplifier may be used as the distortion generated by the distortion-compensating distortion generation means.

In addition, distortion in the amplitude of the signal or distortion in the phase of the signal may be used as the distortion. As a specific example, the distortion-compensating distortion generation means may generate amplitude distortion that decreases or cancels to zero the distortion in amplitude generated by the amplifier and also generate phase distortion that decreases or cancels to zero the distortion in phase generated by the amplifier.

As an example of a configuration of the distortion compensator according to the first aspect of the present invention (hereinafter referred to as Configuration A1), the distortion compensation control value number control means controls the number of pairs of corresponding signal levels and distortion compensation control values in the correspondence between signal levels and distortion compensation control values updated by the distortion compensation control value correspondence update means based on the signal amplified by the amplifier.

In addition, an example of a configuration of Configuration A1 of the distortion compensator according to the present invention, the distortion compensation control value number control means has a distortion component detection means that detects the distortion components arising in the amplifier contained in the signal amplified by the amplifier. Moreover, the distortion compensation control value number control means increases the number of pairs of corresponding signal levels and distortion compensation control values in the correspondence between signal levels and distortion compensation control values updated by the distortion compensation control value correspondence update means together with a decrease in the distortion components detected by the distortion component detection means. In addition, the distortion compensation control value number control means decreases the number of pairs of corresponding signal levels and distortion compensation control values in the correspondence between signal levels and distortion compensation control values updated by the distortion compensation control value correspondence update means together with an increase in the distortion components detected by the distortion component detection means.

Here, various ways of detecting the distortion components arising in the amplifier contained in the signal amplified by the amplifier may be used. For example, the way of detecting components in the frequency band of this distortion in this signal as distortion components can be used.

In addition, the distortion component detection means may detect the power level or amplitude level of the distortion components.

Furthermore, as an example of a configuration of the distortion compensator according to the present invention, the distortion compensation control value number control means controls the number of pairs of corresponding signal levels and distortion compensation control values in the correspondence between signal levels and distortion compensation control values updated by the distortion compensation control value correspondence update means based on the correspondence between the distortion compensation control value numbers and distortion components, to the distortion compensation control value numbers corresponding to the distortion components detected by the distortion component detection means.

In addition, another example of a configuration of Configuration A1 of the distortion compensator according to the present invention comprises a signal modulation means that modulates the signal before amplification by the amplifier. In addition, the distortion compensation control value number control means has signal demodulation means that demodulates the signal amplified by the amplifier, and error detection means that detects error in the signal amplified by the amplifier pertaining to the results of demodulation by the signal demodulation means. Moreover, the distortion compensation control value number control means increases the number of pairs of corresponding signal levels and distortion compensation control values in the correspondence between signal levels and distortion compensation control values updated by the distortion compensation control value correspondence update means together with a decrease in the error detected by the error detection means. In addition, the distortion compensation control value number control means decreases the number of pairs of corresponding signal levels and distortion compensation control values in the correspondence between signal levels and distortion compensation control values updated by the distortion compensation control value correspondence update means together with an increase in the error detected by the error detection means.

Here, the method of modulation performed by the signal modulation means corresponds to the method of demodulation performed by the signal demodulation means, and various methods may be used for these methods.

In addition, the difference from the true signal pertaining to the results of modulation is used as the error in the signal amplified by the amplifier pertaining to the results of demodulation, and this difference can be assumed to be proportional to the magnitude of the distortion arising in the amplifier contained in the signal amplified by the amplifier.

In addition, the power level or amplitude level or another level may be used as the error.

Furthermore, with the distortion compensator according to the present invention, the distortion compensation control value number control means controls the number of pairs of corresponding signal levels and distortion compensation control values in the correspondence between signal levels and distortion compensation control values updated by the distortion compensation control value correspondence update means based on the correspondence between the distortion compensation control value numbers and error, to the distortion compensation control value numbers corresponding to the error detected by the error detection means.

As an example of a configuration of a distortion compensator according to the present invention, in a constitution in which the number of pairs of corresponding signal levels and distortion compensation control values is controlled depending on the elapsed time, the elapsed time measurement means measures the elapsed time based on the point in time when the distortion compensation processing is started on the signal subject to amplification by the amplifier.

Here, as the point in time when the distortion compensation processing is started on the signal subject to amplification by the amplifier, the point in time when this signal is input, or the point in time at which the content of correspondence between signal levels and distortion compensation control values pertaining to this signal or the like may be used.

In addition, as the mode of measuring the elapsed time using this point in time as the reference a mode wherein the elapsed time at this point in time is taken to be zero and the elapsed time thereafter is measured may be used.

Furthermore, as an example of a configuration of the distortion compensator according to the present invention, the distortion compensation control value number control means controls the number of pairs of corresponding signal levels and distortion compensation control values in the correspondence between signal levels and distortion compensation control values updated by the distortion compensation control value correspondence update means based on the correspondence between the distortion compensation control value numbers and elapsed time, to the distortion compensation control value numbers corresponding to the elapsed time measured by the elapsed time measurement means.

As an example of a configuration of the distortion compensator according to the second aspect of the present invention (hereinafter referred to as Configuration A2), the update amount control means controls the amount by which the correspondence between signal levels and distortion compensation control values is updated by the distortion compensation control value correspondence update means based on the signal amplified by the amplifier.

In addition, an example of a configuration of Configuration A2 of the distortion compensator according to the present invention, the update amount control means has a distortion component detection means that detects the distortion components arising in the amplifier contained in the signal amplified by the amplifier. Moreover, the update amount control means decreases the amount by which the correspondence between signal levels and distortion compensation control values is updated by the distortion compensation control value correspondence update means together with a decrease in the distortion components detected by the distortion component detection means. In addition, the update amount control means increases the amount by which the correspondence between signal levels and distortion compensation control values is updated by the distortion compensation control value correspondence update means together with an increase in the distortion components detected by the distortion component detection means.

Here, various ways of detecting the distortion components arising in the amplifier contained in the signal amplified by the amplifier may be used. For example, the way of detecting components in the frequency band of this distortion in this signal as distortion components can be used.

In addition, the distortion component detection means may detect the power level or amplitude level of the distortion components.

Furthermore, as an example of a configuration of the distortion compensator according to the present invention, the update amount control means controls the amount by which the correspondence between signal levels and distortion compensation control values is updated by the distortion compensation control value correspondence update means based on the correspondence between the amount of updating and distortion components, to the amount of updating corresponding to the distortion components detected by the distortion component detection means.

In addition, another example of a configuration of Configuration A2 of the distortion compensator according to the present invention comprises a signal modulation means that modulates the signal before amplification by the amplifier. In addition, the update amount control means has a signal demodulation means that demodulates the signal amplified by the amplifier, and an error detection means that detects error in the signal amplified by the amplifier pertaining to the results of demodulation by the signal demodulation means. Moreover, the update amount control means decreases the amount by which the correspondence between signal levels and distortion compensation control values is updated by the distortion compensation control value correspondence update means together with a decrease in the error detected by the error detection means. In addition, the update amount control means increases the amount by which the correspondence between signal levels and distortion compensation control values is updated by the distortion compensation control value correspondence update means together with an increase in the error detected by the error detection means.

Here, the method of modulation performed by the signal modulation means corresponds to the method of demodulation performed by the signal demodulation means, and various methods may be used for these methods.

In addition, the difference from the true signal pertaining to the results of modulation is used as the error in the signal amplified by the amplifier pertaining to the results of demodulation, and this difference can be assumed to be proportional to the magnitude of the distortion arising in the amplifier contained in the signal amplified by the amplifier.

In addition, the power level or amplitude level or another level may be used as the error.

Furthermore, as an example of the configuration of the distortion compensator according to the present invention, the update amount control means controls the amount by which the correspondence between signal levels and distortion compensation control values is updated by the distortion compensation control value correspondence update means based on the correspondence between the amount of updating and error, to the amount of updating corresponding to the error detected by the error detection means.

As an example of a configuration of a distortion compensator according to the present invention, in a constitution in which the amount by which the correspondence between signal levels and distortion compensation control values is updated by the distortion compensation control value correspondence update means is controlled depending on the elapsed time, the elapsed time measurement means measures the elapsed time based on the point in time when the distortion compensation processing is started on the signal subject to amplification by the amplifier.

Here, as the point in time when the distortion compensation processing is started on the signal subject to amplification by the amplifier, the point in time when this signal is input, or the point in time at which the content of correspondence between signal levels and distortion compensation control values pertaining to this signal or the like may be used.

In addition, as the mode of measuring the elapsed time using this point in time as the reference a mode wherein the elapsed time at this point in time is taken to be zero and the elapsed time thereafter is measured may be used.

Furthermore, as an example of a configuration of the distortion compensator according to the present invention, the update amount control means controls the amount by which the correspondence between signal levels and distortion compensation control values is updated by the distortion compensation control value correspondence update means based on the correspondence between the amount of updating and elapsed time, to the amount of updating corresponding to the elapsed time measured by the elapsed time measurement means.

As an example of a configuration of the distortion compensator according to the third aspect of the present invention (hereinafter referred to as Configuration A3), the update frequency control means controls the frequency at which the correspondence between signal levels and distortion compensation control values is updated by the distortion compensation control value correspondence update means based on the signal amplified by the amplifier.

In addition, an example of a configuration of Configuration A3 of the distortion compensator according to the present invention, the update frequency control means has a distortion component detection means that detects the distortion components arising in the amplifier contained in the signal amplified by the amplifier. Moreover, the update frequency control means decreases the frequency at which the correspondence between signal levels and distortion compensation control values is updated by the distortion compensation control value correspondence update means together with a decrease in the distortion components detected by the distortion component detection means. In addition, the update frequency control means increases the frequency at which the correspondence between signal levels and distortion compensation control values is updated by the distortion compensation control value correspondence update means together with an increase in the distortion components detected by the distortion component detection means.

Here, various ways of detecting the distortion components arising in the amplifier contained in the signal amplified by the amplifier may be used. For example, the way of detecting components in the frequency band of this distortion in this signal as distortion components can be used.

In addition, the distortion component detection means may detect the power level or amplitude level of the distortion components.

Furthermore, as an example of a configuration of the distortion compensator according to the present invention, the update frequency control means controls the frequency at which the correspondence between signal levels and distortion compensation control values is updated, by the distortion compensation control value correspondence update means based on the correspondence between the update frequency and distortion components, to the update frequency corresponding to the distortion components detected by the distortion component detection means.

In addition, another example of a configuration of Configuration A3 of the distortion compensator according to the present invention comprises a signal modulation means that modulates the signal before amplification by the amplifier. In addition, the update frequency control means has signal demodulation means that demodulates the signal amplified by the amplifier, and error detection means that detects error in the signal amplified by the amplifier pertaining to the results of demodulation by the signal demodulation means. Moreover, the update frequency control means decreases the frequency at which the correspondence between signal levels and distortion compensation control values is updated by the distortion compensation control value correspondence update means together with a decrease in the error detected by the error detection means. In addition, the update frequency control means increases the frequency at which the correspondence between signal levels and distortion compensation control values is updated by the distortion compensation control value correspondence update means together with an increase in the error detected by the error detection means.

Here, the method of modulation performed by the signal modulation means corresponds to the method of demodulation performed by the signal demodulation means, and various methods may be used for these methods.

In addition, the difference from the true signal pertaining to the results of modulation is used as the error in the signal amplified by the amplifier pertaining to the results of demodulation, and this difference can be assumed to be proportional to the magnitude of the distortion arising in the amplifier contained in the signal amplified by the amplifier.

In addition, the power level or amplitude level or another level may be used as the error.

Furthermore, as an example of the configuration of the distortion compensator according to the present invention, the update frequency control means controls the frequency at which the correspondence between signal levels and distortion compensation control values is updated, by the distortion compensation control value correspondence update means based on the correspondence between the update frequency and error, to the update frequency corresponding to the error detected by the error detection means.

In addition, as an example of a configuration of a distortion compensator according to the present invention, in a constitution in which the frequency at which the correspondence between signal levels and distortion compensation control values is updated by the distortion compensation control value correspondence update means is controlled depending on the elapsed time, the elapsed time measurement means measures the elapsed time based on the point in time when the distortion compensation processing is started on the signal subject to amplification by the amplifier.

Here, as the point in time when the distortion compensation processing is started on the signal subject to amplification by the amplifier, the point in time when this signal is input, or the point in time at which the content of correspondence between signal levels and distortion compensation control values pertaining to this signal or the like may be used.

In addition, as the mode of measuring the elapsed time using this point in time as the reference a mode wherein the elapsed time at this point in time is taken to be zero and the elapsed time thereafter is measured may be used.

Furthermore, as an example of a configuration of the distortion compensator according to the present invention, the update frequency control means controls the frequency at which the correspondence between signal levels and distortion compensation control values is updated, by the distortion compensation control value correspondence update means based on the correspondence between the update frequency and elapsed time, to the update frequency corresponding to the elapsed time measured by the elapsed time measurement means.

The distortion compensator according to the first, second and third aspects of the present invention as described above may be applied to the base station units or relay amplifier units provided in a mobile communications system.

As an example, with the base station units according to the present invention, distortion compensators such as those described above are provided, and these distortion compensators compensate for the distortion arising in the amplifiers that amplify the signals that are transmitted wirelessly to the mobile station units.

Here, various systems such as cellular phone systems or Personal Handy phone Systems (PHS) may be used as the mobile communications system.

In addition, various communication protocols can be used as the communication protocol. For example, Code Division Multiple Access (CDMA), Time Division Multiple Access (TDMA), Frequency Division Multiple Access (FDMA) or other communications protocols may be used.

In addition, units of various constitutions may be used as the base station units, relay amplifier units or mobile station units of the mobile communications system.

In addition, as an example, the base station unit according to the present invention may consist of a base station unit of a mobile communications system that adopts the W-CDMA protocol.

In addition, as an example, the base station unit according to the present invention uses a common amplifier as the amplifier that performs distortion compensation with a distortion compensator, and a multi-carrier signal is amplified by this common amplifier.

Here, it is possible to amplify a signal of a plurality of signals together with the common amplifier.

In addition, a signal containing signals of a plurality of frequencies is used as the multi-carrier signal.

In addition, various numbers may be used as the number of signals of a plurality of frequencies contained in the multi-carrier signal.

BRIEF EXPLANATION OF THE DRAWINGS

FIG. 3 is a diagram showing an example of an interpolation point number control table.

FIG. 9 is a diagram showing an example of an interpolation point number control table.

FIG. 12 is a diagram showing an example of an interpolation point update amount control table.

FIG. 14 is a diagram showing an example of an interpolation point update amount control table.

FIG. 15 is a diagram showing an example of an interpolation point update frequency control table.

FIG. 16 is a diagram showing an example of an interpolation point update frequency control table.

DETAILED DESCRIPTION OF THE INVENTION

Figure 1:
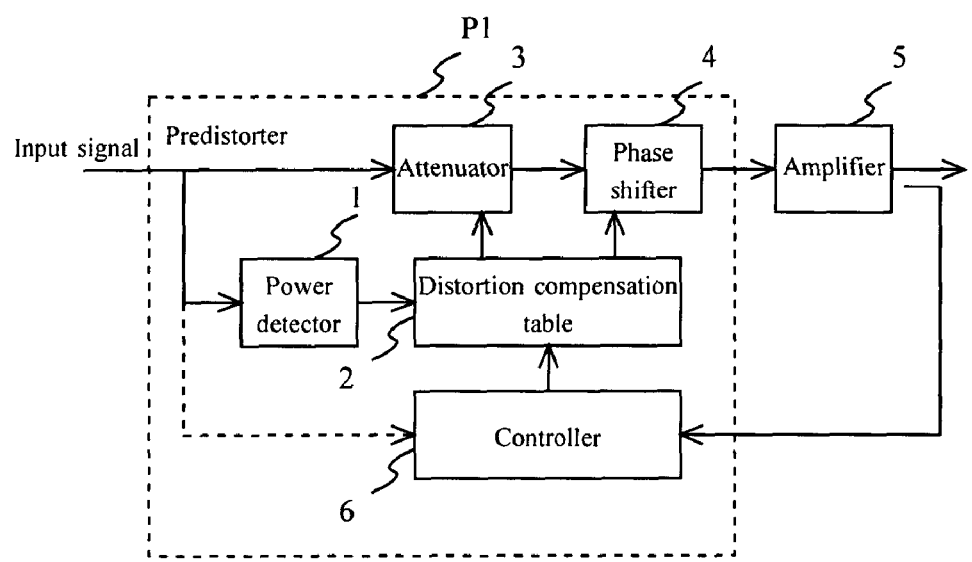
FIG. 1 is a diagram showing an example of the configuration of a transmission power amplifier equipped with a predistorter according to Embodiment 1-1, Embodiment 2-1 and Embodiment 3-1.

Here follows a description of embodiments of the present invention made with reference to drawings.

This embodiment presents the case of applying the present invention to a transmission power amplifier equipped with a predistorter provided in the base station unit of a mobile communications system that adopts the W-CDMA protocol. With the transmission power amplifier equipped with a predistorter according to this embodiment, at the time that a signal to be wirelessly transmitted to a mobile station unit or the like is amplified with an amplifier, the distortion arising in this amplifier is compensated for by a predistorter, thus decreasing the adjacent channel leak power and maintaining good communications quality.

In the transmission power amplifier equipped with a predistorter according to this embodiment, at the time of compensating for distortion arising in an amplifier that amplifies a signal, a signal level detection function detects the level of the signal amplified by the amplifier, a distortion compensation execution function executes distortion compensation with respect to the signal amplified by the amplifier by a mode of distortion compensation corresponding to the signal level detected by the signal level detection function based on the correspondence between signal levels and distortion compensation control values that determine the mode of distortion compensation, a distortion compensation control value correspondence update function updates the correspondence between signal levels and distortion compensation control values used in the execution of distortion compensation by the distortion compensation execution function based on the signal amplified by the amplifier, and a distortion compensation control value correspondence updating mode parameter value control function controls the values of stipulated parameters (objects of control) regarding the mode of updating by the distortion compensation control value correspondence update function.

In this embodiment, according to a first aspect of the present invention, as the values of stipulated parameters pertaining to the mode of updating by the distortion compensation control value correspondence update function, the number of pairs of corresponding signal levels and distortion compensation control values in the correspondence between signal levels and distortion compensation control values updated by the distortion compensation control value correspondence update function is used.

In addition, according to a second aspect of the present invention, as the values of stipulated parameters pertaining to the mode of updating by the distortion compensation control value correspondence update function, the amount by which the correspondence between signal levels and distortion compensation control values is updated by the distortion compensation control value correspondence update means is used.

In addition, according to a third aspect of the present invention, as the values of stipulated parameters pertaining to the mode of updating by the distortion compensation control value correspondence update function, the frequency at which the correspondence between signal levels and distortion compensation control values is updated by the distortion compensation control value correspondence update means is used.

Here follows a description of Embodiment 1 of the present invention.

We shall first describe Embodiment 1-1.

FIG. 1 is a diagram showing an example of a transmission power amplifier equipped with a predistorter.

The transmission power amplifier equipped with a predistorter according to this embodiment is provided with a predistorter P1 and an amplifier 5.

In addition, the predistorter P1 is provided with a power detector 1, distortion compensation table 2, attenuator 3, phase shifter 4 and a controller 6.

We shall first describe examples of the overall configuration and operation of the transmission power amplifier equipped with a predistorter according to this embodiment.

The signal subject to amplification by the amplifier 5 is input to the predistorter P1 and distributed by the predistorter P1 for input to the power detector 1, attenuator 3 and controller 6. Note that in this embodiment, a signal in the radiofrequency (RF) band is input to the predistorter P1 as the signal subject to amplification by the amplifier 5.

The power detector 1 detects the power value of the input signal as the signal subject to amplification by the amplifier 5 and outputs the results of this detection to the distortion compensation table 2.

The distortion compensation table 2 consists of a table that has a distortion compensation characteristic. Specifically, it has information indicating the correspondence between the amount of distortion compensation and the power value of the signal. Here, an inverse characteristic with a nonlinear characteristic in the amplification-phase plane generated by the amplifier 5 is used. In addition, AM—AM (Amplitude Modulation-Amplitude Modulation) conversion and AM-PM (Amplitude Modulation-Phase Modulation) conversion are generally generated as an index of the power of the input signal.

In this embodiment, as the amount of distortion compensation, information for controlling the amount of attenuation of signals by the attenuator 3 (the attenuator control amount) and information for controlling the amount of phase shift of signals by the phase shifter 4 (the phase shifter control amount) are kept in the distortion compensation table 2.

Moreover, upon receiving input of the power value from the power detector 1 the distortion compensation table 2 provides output of the attenuator control amount corresponding to that power value to the attenuator 3 and output of the phase shifter control amount corresponding to that power value to the phase shifter 4. To wit, an attenuator control amount corresponding to AM—AM conversion is input to the attenuator 3 so that the amplitude of the signal is controlled by this attenuator 3, while a phase shifter control amount corresponding to AM-PM conversion is input to the phase shifter 4 so that the phase of the signal is controlled by this phase shifter 4.

The attenuator 3 may consist of a variable attenuator that provides a variable amount of attenuation to the signal and attenuates the input signal which is subject to amplification by the amplifier 5 by an amount of attenuation corresponding to the attenuator control amount input from the distortion compensation table 2, and then outputs the attenuated signal to the phase shifter 4. Note that in the attenuator 3, this attenuation may generate amplitude distortion with respect to the signal.

The phase shifter 4 may consist of a variable phase shifter that provides a variable amount of phase shift to the signal and changes the phase of (phase-shifts) the signal input from the attenuator 3 by the phase shift amount input from the distortion compensation table 2, and then outputs the phase-shifted signal to the amplifier 5 as the output from the predistorter P1. Note that in the phase shifter 4, this attenuation may generate phase distortion with respect to the signal.

The amplifier 5 may consist of a power amplifier which amplifies the signal input from the phase shifter 4 and outputs this amplified signal. Here, amplitude distortion and phase distortion are generated in the amplifier 5 when the signal is amplified, and these distortions are compensated for by the amplitude distortion given the signal by the attenuator 3 and the phase distortion given by the phase shifter 4. Thereby, an amplified signal with no or reduced distortion is output to the outside from the transmission power amplifier equipped with a predistorter according to this embodiment.

In addition, a portion of the signal output from the amplifier 5 is divided and input to the controller 6 as a feedback signal.

The controller 6 may then update the content of the distortion compensation table 2 in order to improve the accuracy of distortion compensation by decreasing the amount of distortion contained in the amplified signal based on this amplified signal input from the amplifier 5.

In addition, in this embodiment, interpolation is used as the method of generating the content of the distortion compensation table 2 which is updated by the controller 6. Interpolation may be used in order to shorten the convergence time of the distortion compensation table 2 or to resolve the problem of smoothing of the distortion compensation table 2. With the interpolation according to this embodiment, the attenuator control amounts and phase shifter control amounts corresponding to representative signal power values are calculated and the attenuator control amounts and phase shifter control amounts corresponding to other signal power values are calculated by interpolation.

Note that in this specification, the points at these representative signal power values are called interpolation points and the number of these interpolation points is called the number of interpolation points.

Here follows a description of an example of the constitution and operation related to control of the number of interpolation points.

Figure 2:
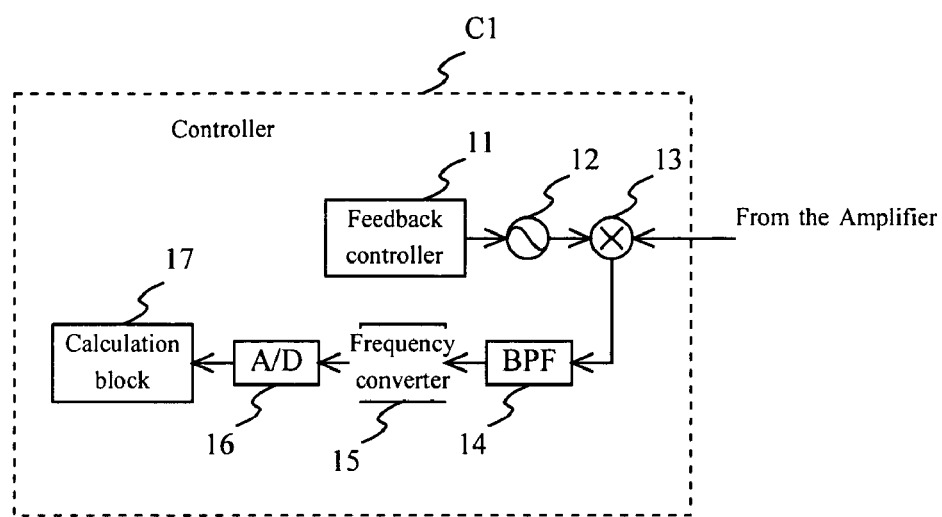
FIG. 2 is a diagram showing an example of the configuration of the controller.

FIG. 2 shows an example of the configuration of a controller C1 used as the controller 6 of this embodiment.

The controller 6 of this embodiment consists of a feedback controller 11, voltage controlled oscillator (VCO) 12, mixer 13, bandpass filter (BPF) 14, frequency converter 15, analog-to-digital (A/D) converter 16 and a calculation block (interpolation point number calculation block) 17.

The feedback controller 11 controls the VCO 12, and in this embodiment, controls the oscillation frequency of the VCO 12 to a frequency at which the distortion power in the desired band is extracted by the BPF 14 (to be described later).

The VCO 12 generates a signal of the frequency controlled by the feedback controller 11 and outputs it to the mixer 13.

The mixer 13 mixes the signal input from the VCO 12 with the amplified signal input from the amplifier 5, performs frequency conversion on this amplified signal and outputs the result of this mixing to the BPF 14. Here, in the controller 6 of this embodiment, control is exerted such that the distortion components arising in the amplifier 5 are included in the results of this mixing.

The BPF 14 filters the results of mixing input from the mixer 13 and extracts components of the stipulated band, and outputs the results of this extraction to the frequency converter 15. Here, in the controller 6 of this embodiment, this stipulated band is set so that the distortion components arising in the amplifier 5 are contained in the results of this extraction.

The frequency converter 15 converts the frequency of the extracted results input from the BPF 14 to a frequency near that of direct current (DC) so that the signal passing through the BPF 14 can be taken in by the A/D converter 16, and outputs the converted results of extraction to the A/D converter 16.

The A/D converter 16 converts the extracted results input from the frequency converter 15 from an analog signal to a digital signal which is output to the interpolation point number calculation block 17. Here, the digital signal input to the interpolation point number calculation block 17 indicates the amount of distortion generated in the amplifier 5 or an amount proportional thereto. Note that the amount of power may be used as the amount of distortion.

The interpolation point number calculation block 17 calculates the number of interpolation points based on the digital signal input from the A/D converter 16 and exerts control over the number of interpolation points.

Here, we shall describe in detail the process by which the interpolation point number calculation block 17 controls the number of interpolation points using the distortion power amount generated outside the band of the signal subject to amplification by the amplifier 5 as a feedback signal.

FIG. 3 is a diagram showing an example of a table used to control the number of interpolation points (interpolation point number control table), where this interpolation point number control table is stored in the memory of the interpolation point number calculation block 17.

In the interpolation point number control table of this embodiment, the correspondence between the range of the distortion amount E and the number of interpolation points is set in advance. Note that the notation "or error signal" in the interpolation point number control table shown in FIG. 3 will be described in another embodiment to be described later, so it is not used in this embodiment.

Specifically, in this embodiment, taking N to be a number greater than or equal to 2, a group of threshold values is set up so that the relationships among the threshold values $Th_{(N-1)}$ are as such: first threshold value $Th_1$>second threshold value $Th_2$> . . . >$(N-2)^{th}$ threshold value $Th_{(N-2)}$>$(N-1)^{th}$ threshold value $Th_{(N-1)}$. In addition, a group of numbers of interpolation points is set up so that the relationships among the numbers of interpolation points $A_{(N)}$ are as such: first number of interpolation points $A_1$<second number of interpolation points $A_2$< ... <$N^{th}$ number of interpolation points $A_{(N)}$.

Thus in the interpolation point number control table of this embodiment, the interpolation point update amount $A_1$ corresponds to the case in which $Th_1$<E, the interpolation point update amount $A_2$ corresponds to the case in which $Th_2$<E≦$Th_1$, ... the interpolation point update amount $A_{(N-1)}$ corresponds to the case in which $Th_{(N-1)}$<E≦$Th_{(N-2)}$, and the interpolation point update amount $A_{(N)}$ corresponds to the case in which 0≦E≦$Th_{(N-1)}$. With this correspondence, the greater the distortion amount E is, the smaller the number of interpolation points A is controlled to be, while the smaller the distortion amount E is, the greater the number of interpolation points A is controlled to be.

Figure 4:
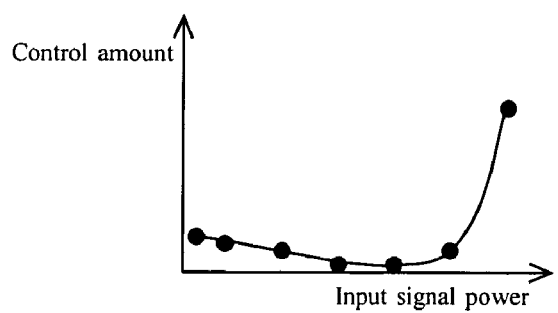
FIG. 4 is a diagram showing an example of a distortion compensation table.
Figure 4:
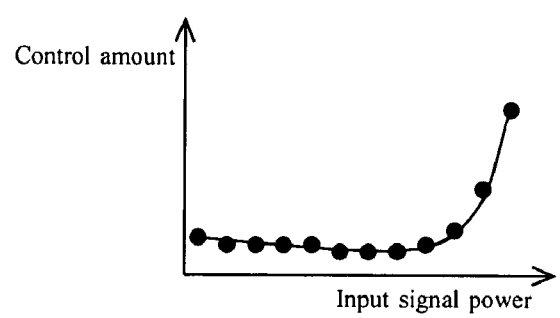

FIGS. 4(a) and (b) illustrate an example of a distortion compensation table. Note that the horizontal axis presents the power of the input signal subject to amplification, while the vertical axis presents the control amount. Here, the attenuator control amount or phase shifter control amount is used as the control amount in this embodiment.

In addition, the points indicated by black circles are equivalent to the interpolation points while the lines connecting the interpolation points are equivalent to the relationship of the control amount as a function of the input signal power obtained by interpolation.

FIG. 4(a) presents an example of a distortion compensation table in the case that the number of interpolation points is relatively small. This is equivalent to the situation in which the amount of distortion contained in the feedback signal from the amplifier 5 is relatively large being equivalent to a situation in the midst of the process of convergence.

On the other hand, FIG. 4(b) presents an example of a distortion compensation table in the case that the number of interpolation points is relatively large. This is equivalent to the situation in which the amount of distortion contained in the feedback signal from the amplifier 5 is relatively small being equivalent to a situation in which the convergence is optimized or nearly optimized.

The interpolation point number calculation block 17 performs a lookup on the interpolation point number control table presented in FIG. 3, and adaptively controls the number of interpolation points of distortion compensation table 2 depending on the magnitude of the distortion amount reported via A/D converter 16. At a stage such as that illustrated in FIG. 4(a) above, the number of interpolation points is small so high-speed convergence can be expected. On the other hand, at a stage such as that illustrated in FIG. 4(b) above, the number of interpolation points is large so the accuracy of distortion compensation can be improved.

Figure 5:
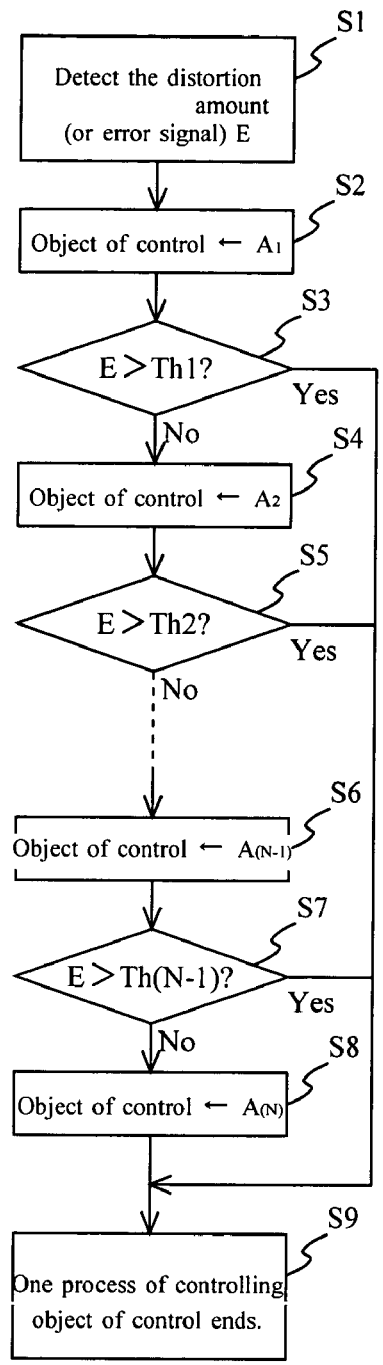
FIG. 5 is a diagram showing an example of the procedure for the control process performed by the controller.

Here follows a description of an example of the procedure for the process of controlling the number of interpolation points performed by the controller 6 with reference to FIG. 5. Note that the notation "or error signal" in the interpolation point number control table in this figure will be described in another embodiment to be described later, so it is not used in this embodiment.

First of all, the power detector 1 detects the distortion amount E (Step S1).

Next, the controller 6 sets the object of control (number of interpolation points) to $A_1$ (Step S2), determines whether the distortion amount E is greater than the threshold value $Th_1$ or not (Step S3). As a result, if the controller 6 determines that this distortion amount E is greater than the threshold value $Th_1$, the interpolation point number control process for this result of detection ends (Step S9).

On the other hand, if the controller 6 determines that the distortion amount E is less than or equal to threshold value $Th_1$, it sets the number of interpolation points to $A_2$ (Step S4) and also determines whether the distortion amount E is greater than the threshold value $Th_2$ or not (Step S5). As a result, if the controller 6 determines that this distortion amount E is greater than the threshold value $Th_2$, the interpolation point number control process for this result of detection ends (Step S9). If this distortion amount E is determined to be less than or equal to threshold value $Th_2$, then the same process is performed for the next threshold value $Th_3$.

The controller 6 sequentially performs the same process for the subsequent threshold values. For example, if the controller 6 determines that the distortion amount E is less than or equal to threshold value $Th_{(N-2)}$, it sets the number of interpolation points to $A_{(N-1)}$ (Step S6) and also determines whether the distortion amount E is greater than the threshold value $Th_{(N-1)}$ or not (Step S7). As a result, if the controller 6 determines that this distortion amount E is greater than the threshold value $Th_{(N-1)}$, the interpolation point number control process for this result of detection ends (Step S9).

On the other hand, if the controller 6 determines that the distortion amount E is less than or equal to threshold value $Th_{(N-1)}$, it sets the number of interpolation points to $A_{(N)}$ (Step S8) and the interpolation point number control process for this result of detection ends (Step S9).

As described above, with a transmission power amplifier equipped with a predistorter according to this embodiment, in the predistorter P1 that does a lookup of the distortion compensation table 2 to perform distortion compensation on the amplifier 5, the output signal from the amplifier 5 subject to distortion compensation is fed back and the number of interpolation points in the generation of the distortion compensation table 2 is adaptively controlled depending on the distortion amount detected from this feedback signal. In the transmission power amplifier equipped with a predistorter according to this embodiment, control is exerted so that the number of interpolation points is decreased when the distortion amount in the feedback is large and the number of interpolation points is increased when the distortion amount in the feedback is small, and thus the number of interpolation points is adaptively controlled by the interpolation method used to generate the distortion compensation table 2.

As a specific configuration, the transmission power amplifier equipped with a predistorter according to this embodiment comprises a signal level detection function 1 that detects the level of the signal subject to amplification by the amplifier 5, distortion compensation functions 2, 3 and 4 that compensate for distortion contained in this signal based on the results detected by the signal level detection function 1, and a controller 6 that controls the number of interpolation points based on the distortion amount in the results output from the amplifier 5. For example, at the time that the distortion compensation functions 2, 3 and 4 perform distortion compensation, and also updates the distortion compensation table 2 based on the results output from the amplifier 5 and the input signal to the predistorter P1, thereby compensating for distortion arising in the amplifier 5. In addition, in order to control the number of interpolation points in the transmission power amplifier equipped with a predistorter according to this embodiment, a preset interpolation point number control table is used.

Accordingly, with a transmission power amplifier equipped with a predistorter according to this embodiment, the efficiency of the process of updating the distortion compensation table 2 can be improved by adaptively controlling the number of interpolation points of the distortion compensation table 2 as described above. Specifically, it is possible to increase the speed of convergence of the distortion compensation table 2 over the overall update process, and it is possible to increase the accuracy of distortion compensation of the predistorter P1 as the convergence proceeds. To wit, in the process of updating the distortion compensation table 2 according to this embodiment, in the initial stages, the number of interpolation points is small so the speed of convergence is increased, but as convergence proceeds, the number of interpolation points increases so the accuracy of distortion compensation can be increased, thereby achieving an extremely efficient distortion compensation process overall.

Note that in this embodiment, the amplifier 5 is equivalent to the amplifier subject to distortion compensation.

In addition, in this embodiment, the distortion compensator is constituted by the functions of the predistorter P1.

In addition, the signal level detection means is constituted by the functions of the power detector 1, the distortion compensation execution means is constituted by the functions of the distortion compensation table 2, functions of the attenuator 3 and functions of the phase shifter 4, while the distortion compensation control value correspondence update means and distortion compensation control value number control means are constituted by the functions of the controller 6.

In addition, in this embodiment, the distortion compensation control values are constituted by the control amounts at interpolation points, the correspondence between control amounts and signal power values is stored in the distortion compensation table 2, and the mode of distortion compensation by the attenuator 3 and phase shifter 4 is determined by the control amount, while the number of interpolation points is equivalent to the number of corresponding pairs of control amounts and signal power values.

In addition, in this embodiment, the distortion compensation control value interpolation means is constituted by the functions of the controller 6.

In addition, in this embodiment, the correspondence between the number of interpolation points and conditions pertaining to the distortion components (distortion amounts) is stored in the interpolation point number control table.

In addition, in this embodiment, the distortion compensation control value correspondence storage means is constituted by the functions of the distortion compensation table 2, the distortion-compensating distortion generation means is constituted by the functions of the attenuator 3 and functions of the phase shifter 4, while the distortion component detection means is constituted by the functions of the feedback controller 11, functions of the VCO 12, functions of the mixer 13 and functions of the BPF 14.

We shall now describe Embodiment 1-2.

Figure 6:
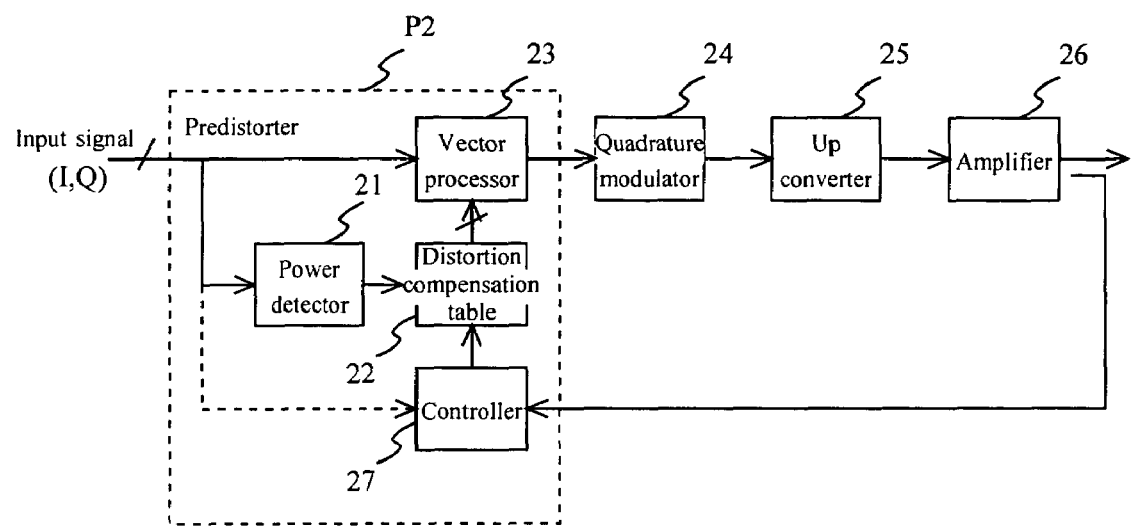
FIG. 6 is a diagram showing an example of the configuration of a transmission power amplifier equipped with a predistorter according to Embodiment 1-2, Embodiment 2-2 and Embodiment 3-2.

FIG. 6 is a diagram showing an example of a transmission power amplifier equipped with a predistorter.

The transmission power amplifier equipped with a predistorter according to this embodiment is provided with a predistorter P2, quadrature modulator 24, up converter 25 and an amplifier 26.

In addition, the predistorter P2 is provided with a power detector 21, distortion compensation table 22, vector processor 23 and a controller 27.

We shall first describe examples of the overall configuration and operation of the transmission power amplifier equipped with a predistorter according to this embodiment.

The predistorter P2 according to this embodiment is a predistorter that processes baseband signals, which accepts input of baseband signals consisting of I components and Q components as the signal subject to amplification by the amplifier 26.

The baseband signal subject to amplification by the amplifier 26 is input to the predistorter P2 and distributed by the predistorter P2 for input to the power detector 21, vector processor 23 and controller 27.

The power detector 21 detects the power value of the signal input as the signal subject to amplification by the amplifier 26 and outputs the results of this detection to the distortion compensation table 22.

The distortion compensation table 22 consists of a table that has a distortion compensation characteristic. Specifically, it has information indicating the correspondence between the amount of distortion compensation and the power value of the signal.

In this embodiment, as the amount of distortion compensation, information for controlling the signal processing by the vector processor 23 (the control amount) is kept in the distortion compensation table 22.

Moreover, upon receiving input of the power value from the power detector 21 the distortion compensation table 22 provides output of the control amount corresponding to the power value to the vector processor 23.

The vector processor 23 may consist of a complex multiplier that distorts the input signal subject to amplification by the amplifier 26 by the control amount input from the distortion compensation table 22, and then outputs this distorted signal to the quadrature modulator 24 as output from the predistorter P2. Note that in the vector processor 23, the vector processing may add amplitude distortion and phase distortion to the signal. The vector processor 23 according to this embodiment may implement the functions of the attenuator 3 and the functions of the phase shifter 4 illustrated in FIG. 1 with respect to the baseband signal.

The quadrature modulator 24 performs the quadrature modulation process wherein the signal input from the vector processor 23 is used for quadrature modulation of the carrier wave, and outputs the signal resulting from this quadrature modulation to the up converter 25.

The up converter 25 converts the frequency of the signal input from the quadrature modulator 24 up to the radiofrequency (RF) band, and outputs the frequency-converted signal to the amplifier 26.

The amplifier 26 may consist of a power amplifier which amplifies the signal input from the up converter 25 and outputs this amplified signal. Here, amplitude distortion and phase distortion are generated in the amplifier 26 when the signal is amplified, and these distortions are compensated for by the amplitude distortion given the signal by the vector processor 23. Thereby, an amplified signal with no or reduced distortion is output to the outside from the transmission power amplifier equipped with a predistorter according to this embodiment.

In addition, a portion of the signal output from the amplifier 26 is divided and input to the controller 27 as a feedback signal.

The controller 27 may then update the content of the distortion compensation table 22 in order to improve the accuracy of distortion compensation by decreasing the amount of distortion contained in the amplified signal based on this amplified signal input from the amplifier 26. The controller 27 according to this embodiment may update the content of the distortion compensation table 22 using an algorithm suited to changes over time and environmental changes.

In addition, in this embodiment, interpolation is used as the method of generating the content of the distortion compensation table 22 which is updated by the controller 27. With the interpolation according to this embodiment, the control amounts of the vector processor 23 corresponding to representative signal power values are calculated and the control amounts corresponding to other signal power values are calculated by interpolation.

Here follows a description of an example of the constitution and operation related to control of the number of interpolation points.

Figure 7:
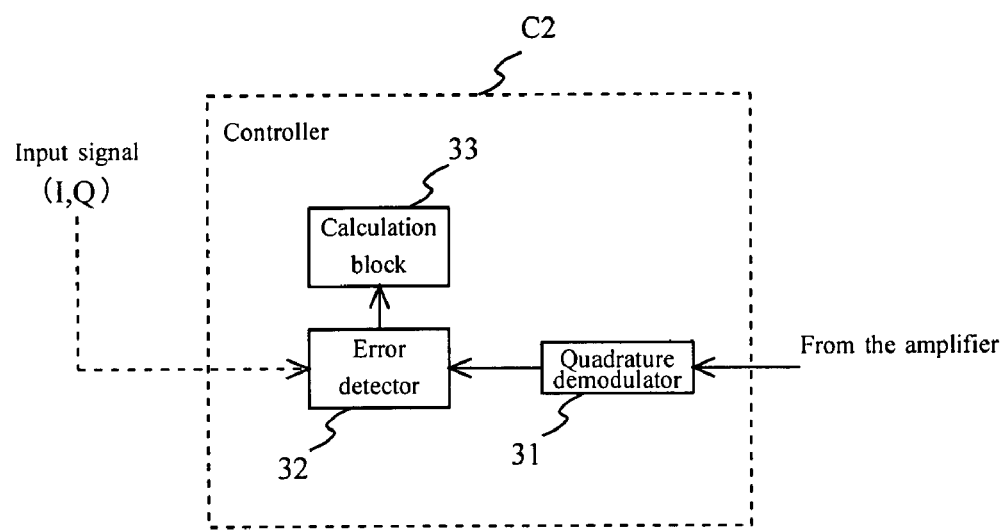
FIG. 7 is a diagram showing an example of the configuration of the controller.

FIG. 7 shows an example of the configuration of a controller C2 used as the controller 27 of this embodiment.

The controller 27 of this embodiment consists of a quadrature demodulator 31, error detector 32 and a calculation block (interpolation point number calculation block) 33.

The quadrature demodulator 31 performs the quadrature demodulation process on the amplified signal input from the amplifier 26, and outputs digital data consisting of the I signal and Q signal obtained by this quadrature demodulation to the error detector 32 for use as feedback.

The error detector 32 detects a signal consisting of the difference between the signal consisting of the I component and Q component input as the signal subject to amplification by the amplifier 26 and the signal consisting of the I component and Q component input from the quadrature demodulator 31 as the error (in this embodiment, the vector error) signal, and outputs this detected error signal to the interpolation point number calculation block 33. Here, as this error signal the amplified signal after the amplification process of the amplifier 26 may be detected as components shifted with respect to the signal before amplification, and the distortion components arising in the amplifier 26 or components proportional thereto may be detected.

The interpolation point number calculation block 33 calculates the number of interpolation points based on the error signal input from the error detector 32 and exerts control over the number of interpolation points.

Here the process of controlling the number of interpolation points using this error signal as a feedback signal may be implemented in the same manner as the interpolation point number control process described in Embodiment 1-1 above.

Specifically, an interpolation point number control table like that illustrated in FIG. 3 above is stored in the memory of the interpolation point number calculation block 33 of this embodiment. In this embodiment, the "error signal" E is used instead of the "distortion amount" illustrated in FIG. 3 above, so the correspondence between the number of interpolation points and the range of the error signal E is contained in the interpolation point number control table. Moreover, the greater the error signal E is the smaller the number of interpolation points A is controlled to be, while the smaller the error signal E is the greater the number of interpolation points A is controlled to be.

In addition, as an example of the procedure for the process of controlling the number of interpolation points performed by the controller 27 of this embodiment one like that illustrated in FIG. 5 above may be used. In this embodiment, use "error signal" instead of "distortion amount" in FIG. 5 above.

As described above, with a transmission power amplifier equipped with a predistorter according to this embodiment, in the predistorter P2 that does a lookup of the distortion compensation table 22 to perform distortion compensation on the amplifier 26, the output signal from the amplifier 26 subject to distortion compensation is fed back and the number of interpolation points in the generation of the distortion compensation table 22 is adaptively controlled depending on this feedback signal and the error amount detected from the input signal to the predistorter P2. In the transmission power amplifier equipped with a predistorter according to this embodiment, control is exerted so that the number of interpolation points is decreased when the detected error amount is large and the number of interpolation points is increased when this error amount is small, and thus the number of interpolation points is adaptively controlled by the interpolation method used to generate the distortion compensation table 22.

As a specific configuration, the transmission power amplifier equipped with a predistorter according to this embodiment comprises a signal level detection function 21 that detects the level of the signal subject to amplification by the amplifier 26, distortion compensation functions 22 and 23 that compensate for distortion contained in this signal based on the results detected by the signal level detection function 21, and a controller 27 that controls the number of interpolation points based on the error amount in the results output from the amplifier 26 at the time that the distortion compensation functions 22 and 23 perform distortion compensation, and also updates the distortion compensation table 22 based on the results output from the amplifier 26 and the input signal to the predistorter P2, thereby compensating for distortion arising in the amplifier 26. In addition, in order to control the number of interpolation points in the transmission power amplifier equipped with a predistorter according to this embodiment, a preset interpolation point number control table is used.

Accordingly, with a transmission power amplifier equipped with a predistorter according to this embodiment, the efficiency of the process of updating the distortion compensation table 22 can be improved by adaptively controlling the number of interpolation points of the distortion compensation table 22 as described above. Specifically, it is possible to increase the speed of convergence of the distortion compensation table 22 over the overall update process, and it is possible to increase the accuracy of distortion compensation of the predistorter P2 as the convergence proceeds. To wit, in the process of updating the distortion compensation table 22 according to this embodiment, in the initial stages, the number of interpolation points is small so the speed of convergence is increased, but as convergence proceeds, the number of interpolation points increases so the accuracy of distortion compensation can be increased, thereby achieving an extremely efficient distortion compensation process overall.

Note that in this embodiment, the amplifier 5 is equivalent to the amplifier subject to distortion compensation.

In addition, in this embodiment, the distortion compensator is constituted by the functions of the predistorter P2.

In addition, in this embodiment, the signal level detection means is constituted by the functions of the power detector 21, the distortion compensation execution means is constituted by the functions of the distortion compensation table 22 and functions of the vector processor 23, while the distortion compensation control value correspondence update means and distortion compensation control value number control means are constituted by the functions of the controller 27.

In addition, in this embodiment, the mode of distortion compensation by the vector processor 23 is determined by the control amount.

In addition, in this embodiment, the distortion compensation control value interpolation means is constituted by the functions of the controller 27.

In addition, in this embodiment, the correspondence between the number of interpolation points and conditions pertaining to the distortion components is stored in the interpolation point number control table.

In addition, in this embodiment, the distortion compensation control value correspondence storage means is constituted by the functions of the distortion compensation table 22 and the distortion compensation generation means is constituted by the functions of the vector processor 23.

In addition, in this embodiment, the signal modulation means is constituted by the functions of the quadrature modulator 24, the signal demodulation means is constituted by the functions of the quadrature modulator 31, and the error detection means is constituted by the functions of the error detector 32.

We shall now describe Embodiment 1-3.

Figure 8:
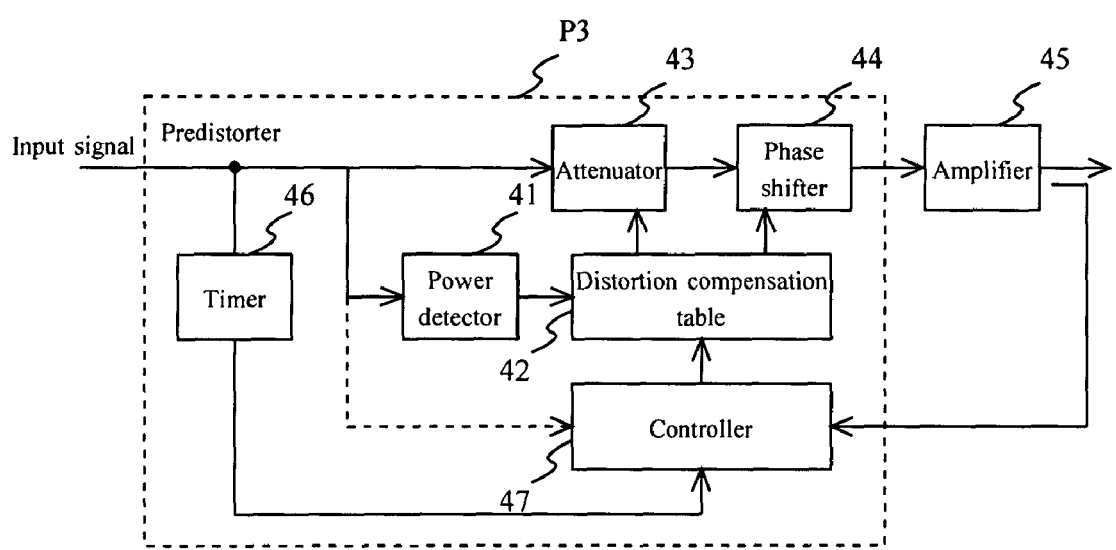
FIG. 8 is a diagram showing an example of the configuration of a transmission power amplifier equipped with a predistorter according to Embodiment 1-3, Embodiment 2-3 and Embodiment 3-3.

FIG. 8 is a diagram showing an example of a transmission power amplifier equipped with a predistorter.

The transmission power amplifier equipped with a predistorter according to this embodiment is provided with a predistorter P3 and an amplifier 45.

In addition, the predistorter P3 is provided with a power detector 41, distortion compensation table 42, attenuator 43, phase shifter 44, timer 46 and a controller 47.

We shall first describe examples of the overall configuration and operation of the transmission power amplifier equipped with a predistorter according to this embodiment.

The signal subject to amplification by the amplifier 45 is input to the predistorter P3 and distributed by the predistorter P3 for input to the power detector 41, attenuator 43, timer 46 and controller 47. Note that in this embodiment, a signal in the radiofrequency (RF) band is input to the predistorter P3 as the signal subject to amplification by the amplifier 45.

In addition, the configuration and operation of the power detector 41, compensation table 42, attenuator 43, phase shifter 44 and amplifier 45 are the same as those of 1, 2, 3, 4 and 5 illustrated in FIG. 1 above.

The timer 46 has the function of measuring time and in this embodiment, it takes the point in time at which the signal subject to amplification by the amplifier 45 is input to be the zero point, measures the elapsed time thereafter and outputs this measured time to the controller 47. Here, this notification of the elapsed time from the timer 46 to the controller 47 may be done constantly or at stipulated time intervals or each time a predetermined amount of time has elapsed.

The controller 47 may update the content of the distortion compensation table 42 in order to improve the accuracy of distortion compensation by decreasing the amount of distortion contained in the amplified signal based on this amplified signal input from the amplifier 45. The controller 47 in this embodiment may update the content of the compensation table 42 using an adaptive algorithm sensitive to changes over time or environmental changes.

In addition, in this embodiment, interpolation is used as the method of generating the content of the distortion compensation table 42 which is updated by the controller 47. With the interpolation according to this embodiment, the attenuator control amounts and phase shifter control amounts corresponding to representative signal power values are calculated and the attenuator control amounts and phase shifter control amounts corresponding to other signal power values are calculated by interpolation.

We shall now describe in detail the process by which the controller 47 of this embodiment controls the number of interpolation points based on the elapsed time.

FIG. 9 is a diagram showing an example of a table used to control the number of interpolation points (interpolation point number control table), where this interpolation point number control table is stored in the memory of the controller 47.

In the interpolation point number control table of this embodiment, the correspondence between the number of interpolation points and the range of the time t from the start of convergence of the compensation table 42 is set in advance. Here, in this embodiment, the elapsed time from the point in time that the signal subject to amplification by the amplifier 45 is input to the predistorter P3 is used as this time t from the start of convergence.

This embodiment utilizes the property wherein the longer the elapsed time from the start of convergence typically the smaller the amount of distortion in the feedback as illustrated in Embodiment 1-1 above and the error signal in the feedback signal illustrated in Embodiment 1-2 above become.

Specifically, in this embodiment, taking N to be a number greater than or equal to 2, a group of threshold values is set up so that the relationships among the threshold values $T_{(N-1)}$ are as such: first threshold value $T_1$<second threshold value $T_2$< ... <$(N-2)^{th}$ threshold value $T_{(N-2)}$<$(N-1)^{th}$ threshold value $T_{(N-1)}$. In addition, a group of numbers of interpolation points is set up so that the relationships among the numbers of interpolation points $A_{(N)}$ are as such: first number of interpolation points $A_1$<second number of interpolation points $A_2$< ... <$N^{th}$ number of interpolation points $A_{(N)}$.

Thus in the interpolation point number control table of this embodiment, the number of interpolation points $A_1$ corresponds to the case in which $0<t\leq T_1$, the number of interpolation points $A_2$ corresponds to the case in which $T_1<t\leq T_2$, ... the number of interpolation points $A_{(N-1)}$ corresponds to the case in which $T_{(N-2)}<t\leq T_{(N-1)}$, while the number of interpolation points $A_{(N)}$ corresponds to the case in which $T_{(N-1)}<t$. With this correspondence, the smaller the elapsed time t is, the smaller the number of interpolation points A is controlled to be, while the greater the elapsed time t is, the greater the number of interpolation points A is controlled to be.

Figure 10:
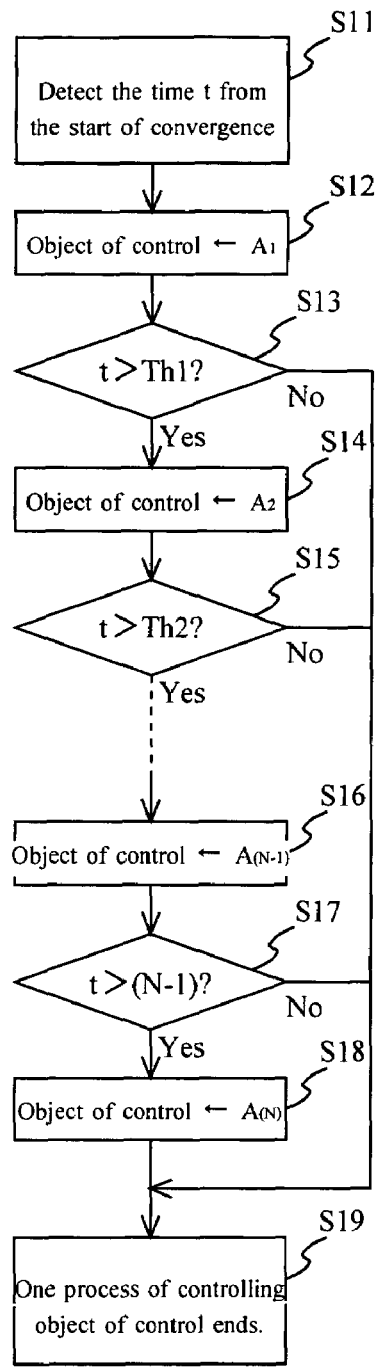
FIG. 10 is a diagram showing an example of the procedure for the control process performed by the controller.

Here follows a description of an example of the procedure for the process of controlling the number of interpolation points performed by the controller 47 with reference to FIG. 10.

The controller 47 first detects the elapsed time t reported by the timer 46 (Step S11).

Next, the controller 47 sets the object of control (number of interpolation points) to $A_1$ (Step S12), determines whether the elapsed time t is greater than the threshold value $T_1$ or not (Step S113). As a result, if the controller 47 determines that this elapsed time t is less than or equal to the threshold value $T_1$, the interpolation point number control process for this result of detection ends (Step S119).

On the other hand, if the controller 47 determines that the elapsed time t is greater than the threshold value $T_1$, it sets the number of interpolation points to $A_2$ (Step S14) and also determines whether the elapsed time t is greater than the threshold value $T_2$ or not (Step S15). As a result, if the controller 47 determines that this elapsed time t is less than or equal to the threshold value $T_2$, the interpolation point number control process for this result of detection ends (Step S19). If this elapsed time t is determined to be greater than the threshold value $T_2$, then the same process is performed for the next threshold value $T_3$.

The controller 47 sequentially performs the same process for the subsequent threshold values. For example, if the controller 47 determines that the elapsed time t is greater than the threshold value $T_{(N-2)}$, it sets the number of interpolation points to $A_{(N-1)}$ (Step S16) and also determines whether the elapsed time t is greater than the threshold value $T_{(N-1)}$ or not (Step S17). As a result, if the controller 47 determines that this elapsed time t is less than or equal to the threshold value $T_{(N-1)}$, the interpolation point number control process for this result of detection ends (Step S19).

On the other hand, if the controller 47 determines that the elapsed time t is greater than the threshold value $T_{(N-1)}$, it sets the number of interpolation points to $A_{(N)}$ (Step S18) and the interpolation point number control process for this result of detection ends (Step S19).

In this manner, in the interpolation point number control process according to this embodiment, this process starts from a small number of interpolation points and the number of interpolation points increases with the elapsed time.

As described above, with a transmission power amplifier equipped with a predistorter according to this embodiment, in the predistorter P3 that does a lookup of the distortion compensation table 42 to perform distortion compensation on the amplifier 45, the number of interpolation points in the generation of the distortion compensation table 2 is adaptively controlled depending on the elapsed time from the start of convergence of the compensation table 42. In the transmission power amplifier equipped with a predistorter according to this embodiment, control is exerted so that the number of interpolation points is decreased when the elapsed time is small and the number of interpolation points is increased when the elapsed time is large, and thus the number of interpolation points is adaptively controlled by the interpolation method used to generate the distortion compensation table 42.

As a specific configuration, the transmission power amplifier equipped with a predistorter according to this embodiment comprises a signal level detection function 41 that detects the level of the signal subject to amplification by the amplifier 45, distortion compensation functions 42, 43 and 44 that compensate for distortion contained in this signal based on the results detected by the signal level detection function 41, a time measurement function 46 that measures the time elapsed in distortion compensation from the point in time that the signal subject to amplification by the amplifier 45 is input, and a controller 47 that controls the number of interpolation points based on the distortion amount in the results output from the amplifier 45 at the time that the distortion compensation functions 42, 43 and 44 perform distortion compensation, and also updates the distortion compensation table 42 based on the results output from the amplifier 45 and the input signal to the predistorter P3, thereby compensating for distortion arising in the amplifier 45. In addition, in order to control the number of interpolation points in the transmission power amplifier equipped with a predistorter according to this embodiment, a preset interpolation point number control table is used.

Accordingly, with a transmission power amplifier equipped with a predistorter according to this embodiment, the efficiency of the process of updating the distortion compensation table 42 can be improved by adaptively controlling the number of interpolation points of the distortion compensation table 42 as described above. Specifically, it is possible to increase the speed of convergence of the distortion compensation table 42 over the overall update process, and it is possible to increase the accuracy of distortion compensation of the predistorter P3 as the convergence proceeds. To wit, in the process of updating the distortion compensation table 42 according to this embodiment, in the initial stages, the number of interpolation points is small so the speed of convergence is increased, but as convergence proceeds, the number of interpolation points increases so the accuracy of distortion compensation can be increased, thereby achieving an extremely efficient distortion compensation process overall.

Note that in this embodiment, the distortion compensator is constituted by the functions of the predistorter P3.

In addition, the elapsed time measurement means is constituted by the functions of the timer 46.

In addition, in this embodiment, the correspondence between the number of interpolation points and conditions related to elapsed time is stored in the distortion compensation table.

We shall now describe Embodiment 1-4.

Figure 11:
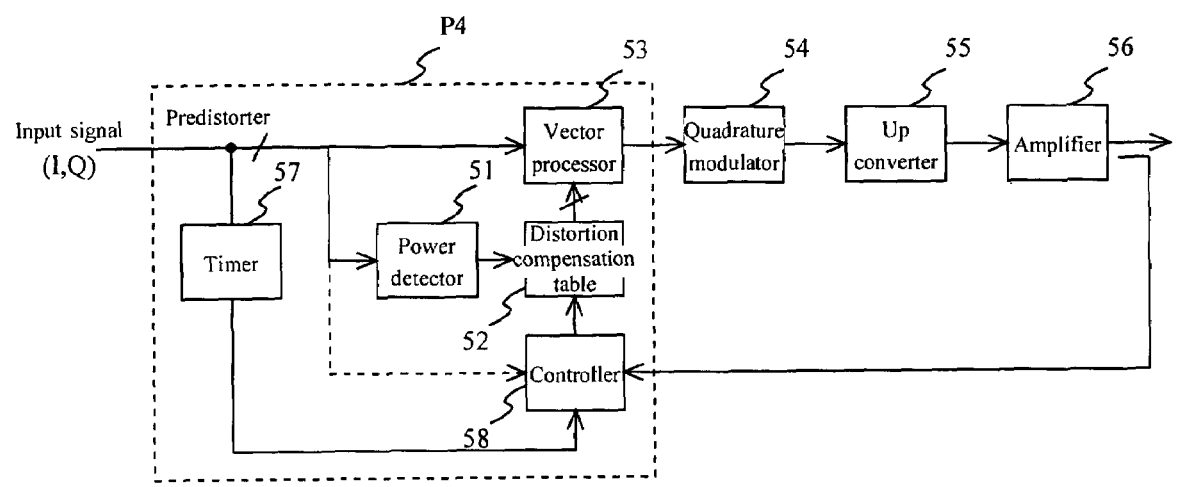
FIG. 11 is a diagram showing an example of the configuration of a transmission power amplifier equipped with a predistorter according to Embodiment 1-4, Embodiment 2-4 and Embodiment 3-4.

FIG. 11 is a diagram showing an example of a transmission power amplifier equipped with a predistorter.

The transmission power amplifier equipped with a predistorter according to this embodiment is provided with a predistorter P4, quadrature modulator 54, up converter 55 and an amplifier 56.

In addition, the predistorter P4 is provided with a power detector 51, distortion compensation table 52, vector processor 53, timer 57 and a controller 58.

We shall first describe examples of the overall configuration and operation of the transmission power amplifier equipped with a predistorter according to this embodiment.

The signal subject to amplification by the amplifier 56 is input to the predistorter P4 and distributed by the predistorter P4 for input to the power detector 51, vector processor 53, timer 57 and controller 58. Note that in this embodiment, a signal in the baseband band may be input to the predistorter P4 as the signal subject to amplification by the amplifier 56.

In addition, the configuration and operation of the power detector 51, distortion compensation table 52, vector processor 53, quadrature modulator 54, up converter 55 and amplifier 56 are the same as those of 21, 22, 23, 24, 25 and 26 illustrated in FIG. 6 above.

The timer 57 has the function of measuring time and in this embodiment, it takes the point in time at which the signal subject to amplification by the amplifier 56 is input to be the zero point, measures the elapsed time thereafter and outputs this measured time to the controller 58. Here, this notification of the elapsed time from the timer 57 to the controller 58 may be done constantly or at stipulated time intervals or each time a predetermined amount of time has elapsed.

The controller 58 may update the content of the distortion compensation table 52 in order to improve the accuracy of distortion compensation by decreasing the amount of distortion contained in the amplified signal based on this amplified signal input from the amplifier 56. The controller 58 in this embodiment may update the content of the compensation table 52 using an adaptive algorithm sensitive to changes over time or environmental changes.

In addition, in this embodiment, interpolation is used as the method of generating the content of the distortion compensation table 52 which is updated by the controller 58. With the interpolation according to this embodiment, the control amounts of the vector processor 53 corresponding to representative signal power values are calculated and the control amounts corresponding to other signal power values are calculated by interpolation.

In addition, the controller 58 calculates the number of interpolation points based on the elapsed time reported from the timer 57 and thus controls the number of interpolation points.

Here, the process by which the controller 58 controls the number of interpolation points using this elapsed time may be implemented in the same manner as in the interpolation point number control process described in Embodiment 1-3 above.

Specifically, an interpolation point number control table like that illustrated in FIG. 9 above is stored in the memory of the controller 58 according to this embodiment.

In addition, as an example of the procedure for the process of controlling the number of interpolation points performed by the controller 58 according to this embodiment, one like that illustrated in FIG. 10 above is used.

As described above, with a transmission power amplifier equipped with a predistorter according to this embodiment, in the same manner as described in Embodiment 1-3 above, in the predistorter P4 that does a lookup of the distortion compensation table 52 to perform distortion compensation on the amplifier 56, the number of interpolation points in the distortion compensation table 52 is adaptively controlled, so the efficiency of the process of updating the distortion compensation table 52 can be improved by adaptively controlling the number of interpolation points of the distortion compensation table 52 as described above.

Note that in this embodiment, the distortion compensator is constituted by the functions of the predistorter P4.

In addition, the elapsed time measurement means is constituted by the functions of the timer 57.

In addition, in this embodiment, the correspondence between the number of interpolation points and conditions related to elapsed time is stored in the distortion compensation table.

As illustrated in Embodiments 1-1 through 1-4 above, with a transmission power amplifier equipped with a predistorter according to this embodiment, by controlling the number of control values used to perform distortion compensation (in this embodiment, the number of interpolation points) at the time that this distortion compensation is performed with respect to distortion arising in an amplifier that amplifies a signal, it is possible to improve the efficiency of distortion compensation.

Here follows a description of Embodiment 2 of the present invention.

We shall first describe Embodiment 2-1.

In this embodiment, we shall describe a transmission power amplifier equipped with a predistorter that has the same configuration as that illustrated in FIG. 1 above and performs the same operation.

Note that in this embodiment, the number of interpolation points (interpolation point number) is constant, but a configuration in which the number of interpolation points is variable may also be used.

Here follows a description of examples of the configuration and operation regarding the control of the amount by which the attenuator control amounts are updated at interpolation points subject to updating in a single update, and the control of the amount by which the phase shifter control amounts are updated at interpolation points subject to updating in a single update. Note that in this embodiment, the way of controlling the amount by which the attenuator control amounts are updated is identical to the way of controlling the amount by which the phase shifter control amounts are updated, so these are described together as the way of controlling the amount by which interpolation points are updated (the interpolation point update amount). In addition, in this embodiment, the amount by which the attenuator control amount is updated and the amount by which the phase shifter control amount is updated may be set separately and may be different from each other.

This embodiment is described using an example of a controller C1 of the same constitution as that illustrated in FIG. 2 above, with only those portions that differ from the above described in detail.

The controller 6 of this embodiment consists of a feedback controller 11, voltage controlled oscillator (VCO) 12, mixer 13, bandpass filter (BPF) 14, frequency converter 15, analog-to-digital (A/D) converter 16 and a calculation block (interpolation point update amount calculation block) 17.

In this embodiment, the A/D converter 16 converts the extracted results input from the frequency converter 15 from an analog signal to a digital signal which is output to the interpolation point update amount calculation block 17. Here, the interpolation point update amount calculation block 17 becomes information that indicates the amount of distortion generated in the amplifier 5 or an amount proportional thereto. Note that the amount of power may be used as the amount of distortion.

The interpolation point update amount calculation block 17 calculates the interpolation point update amount based on the digital signal input from the A/D converter 16 and exerts control over the interpolation point update amount.

Here, we shall describe in detail the process by which the interpolation point update amount calculation block 17 controls the interpolation point update amount using the distortion power amount generated outside the band of the signal subject to amplification by the amplifier 5 as a feedback signal.

FIG. 12 is a diagram showing an example of a table used to control the interpolation point update amount (interpolation point update amount control table), where this interpolation point update amount control table is stored in the memory of the interpolation point update amount calculation block 17.

In the interpolation point update amount control table of this embodiment, the correspondence between the range of the distortion amount E and the interpolation point update amount is set in advance. Note that the notation "or error signal" in the interpolation point update amount control table shown in FIG. 12 will be described in another embodiment to be described later, so it is not used in this embodiment.

Specifically, in this embodiment, taking N to be a number greater than or equal to 2, a group of threshold values is set up so that the relationships among the threshold values $Th_{(N-1)}$ are as such: first threshold value $Th_1$>second threshold value $Th_2$> . . . >$(N-2)^{th}$ threshold value $Th_{(N-2)}$>$(N-1)^{th}$ threshold value $Th_{(N-1)}$. In addition, a group of interpolation point update amounts is set up so that the relationships among the interpolation point update amounts $A_{(N)}$ are as such: first interpolation point update amount $A_1$<interpolation point update amount $A_2$< . . . $(N-1)^{th}$ interpolation point update amount $A_{(N-1)}$>$N^{th}$ interpolation point update amount $A_{(N)}$.

Thus in the interpolation point update amount control table of this embodiment, the interpolation point update amount $A_1$ corresponds to the case in which $Th_1$<E, the interpolation point update amount $A_2$ corresponds to the case in which $Th_2 < E \leq Th_1, \ldots$ the interpolation point update amount $A_{(N-1)}$ corresponds to the case in which $Th_{(N-1)} < E \leq Th_{(N-2)}$ and the interpolation point update amount $A_{(N)}$ corresponds to the case in which $0 \leq E \leq Th_{(N-1)}$. With this correspondence, the greater the distortion amount E is the greater the value the interpolation point update amount A is controlled to be, while the smaller the distortion amount E is the lesser the value the interpolation point update amount A is controlled to be.

Figure 13:
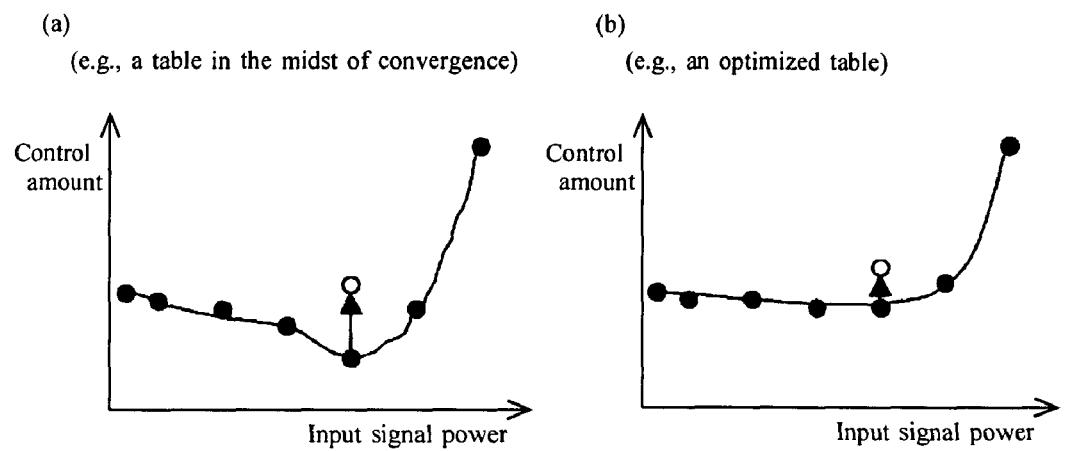
FIG. 13 is a diagram showing an example of a distortion compensation table.

FIGS. 13(a) and (b) illustrate an example of a distortion compensation table. Note that the horizontal axis presents the power of the input signal subject to amplification, while the vertical axis presents the control amount. Here, the attenuator control amount or phase shifter control amount is used as the control amount in this embodiment.

In addition, the points indicated by black circles are equivalent to the interpolation points while the lines connecting the interpolation points are equivalent to the relationship of the control amount as a function of the input signal power obtained by interpolation.

FIG. 13(a) presents an example of a distortion compensation table in the case that the interpolation point update amount is relatively large. This is equivalent to the situation in which the amount of distortion contained in the feedback signal from the amplifier 5 is relatively large being equivalent to a situation in the midst of the process of convergence.

On the other hand, FIG. 13(b) presents an example of a distortion compensation table in the case that the interpolation point update amount is relatively small. This is equivalent to the situation in which the amount of distortion contained in the feedback signal from the amplifier 5 is relatively small being equivalent to a situation in which the convergence is optimized or nearly optimized.

The interpolation point update amount calculation block 17 performs a lookup on the interpolation point update amount control table presented in FIG. 12 above, and adaptively controls the interpolation point update amount of distortion compensation table 2 depending on the magnitude of the distortion amount reported via A/D converter 16. At a stage such as that illustrated in FIG. 13(a) above, the interpolation point update amount is small so high-speed convergence can be expected. On the other hand, at a stage such as that illustrated in FIG. 13(b) above, the interpolation point update amount is large so the accuracy of distortion compensation can be improved.

Here follows a description of an example of the procedure for the process of controlling the interpolation point update amount performed by the controller 6 with reference to FIG. 5 above. Note that the notation "or error signal" in this figure will be described in another embodiment to be described later, so it is not used in this embodiment.

First of all, the controller 6 detects the distortion amount E (Step S1).

Next, the controller 6 sets the object of control (interpolation point update amount) to $A_1$ (Step S2), determines whether the distortion amount E is greater than the threshold value $Th_1$ or not (Step S3). As a result, if the controller 6 determines that this distortion amount E is greater than the threshold value $Th_1$, the interpolation point update amount control process for this result of detection ends (Step S9).

On the other hand, if the controller 6 determines that the distortion amount E is less than or equal to threshold value $Th_1$, it sets the interpolation point update amount to $A_2$ (Step S4) and also determines whether the distortion amount E is greater than the threshold value $Th_2$ or not (Step S5). As a result, if the controller 6 determines that this distortion amount E is greater than the threshold value $Th_2$, the interpolation point update amount control process for this result of detection ends (Step S9). If this distortion amount E is determined to be less than or equal to threshold value $Th_2$, then the same process is performed for the next threshold value $Th_3$.

The controller 6 sequentially performs the same process for the subsequent threshold values. For example, if the controller 6 determines that the distortion amount E is less than or equal to threshold value $Th_{(N-2)}$, it sets the interpolation point update amount to $A_{(N-1)}$ (Step S6) and also determines whether the distortion amount E is greater than the threshold value $Th_{(N-1)}$ or not (Step S7). As a result, if the controller 6 determines that this distortion amount E is greater than the threshold value $Th_{(N-1)}$, the interpolation point update amount control process for this result of detection ends (Step S9).

On the other hand, if the controller 6 determines that the distortion amount E is less than or equal to threshold value $Th_{(N-1)}$, it sets the interpolation point update amount to $A_{(N)}$ (Step S8) and the interpolation point update amount control process for this result of detection ends (Step S9).

As described above, with a transmission power amplifier equipped with a predistorter according to this embodiment, in the predistorter P1 that does a lookup of the distortion compensation table 2 to perform distortion compensation on the amplifier 5, the output signal from the amplifier 5 subject to distortion compensation is fed back and the interpolation point update amount in the generation of the distortion compensation table 2 is adaptively controlled depending on the distortion amount detected from this feedback signal. In the transmission power amplifier equipped with a predistorter according to this embodiment, control is exerted so that the interpolation point update amount is increased when the distortion amount in the feedback is large and the interpolation point update amount is decreased when the distortion amount in the feedback is small, and thus the interpolation point update amount is adaptively controlled by the interpolation method used to generate the distortion compensation table 2.

As a specific configuration, the transmission power amplifier equipped with a predistorter according to this embodiment comprises a signal level detection function 1 that detects the level of the signal subject to amplification by the amplifier 5, distortion compensation functions 2, 3 and 4 that compensate for distortion contained in this signal based on the results detected by the signal level detection function 1, and a controller 6 that controls the interpolation point update amount based on the distortion amount in the results output from the amplifier 5 at the time that the distortion compensation functions 2, 3 and 4 perform distortion compensation, and also updates the distortion compensation table 2 based on the results output from the amplifier 5 and the input signal to the predistorter P1, thereby compensating for distortion arising in the amplifier 5. In addition, in order to control the interpolation point update amount in the transmission power amplifier equipped with a predistorter according to this embodiment, a preset interpolation point update amount control table is used.

Accordingly, with a transmission power amplifier equipped with a predistorter according to this embodiment, the efficiency of the process of updating the distortion compensation table 2 can be improved by adaptively controlling the interpolation point update amount of the distortion compensation table 2 as described above. Specifically, it is possible to increase the speed of convergence of the distortion compensation table 2 over the overall update process, and it is possible to increase the accuracy of distortion compensation of the predistorter P1 as the convergence proceeds. To wit, in the process of updating the distortion compensation table 2 according to this embodiment, in the initial stages, the interpolation point update amount is large so the speed of convergence is increased, but as convergence proceeds, the interpolation point update amount decreases so the accuracy of distortion compensation can be increased, thereby achieving an extremely efficient distortion compensation process overall.

Note that in this embodiment, the amplifier 5 is equivalent to the amplifier subject to distortion compensation.

In addition, in this embodiment, the distortion compensator is constituted by the functions of the predistorter P1.

In addition, the signal level detection means is constituted by the functions of the power detector 1, the distortion compensation execution means is constituted by the functions of the distortion compensation table 2, functions of the attenuator 3 and functions of the phase shifter 4, while the distortion compensation control value correspondence update means and distortion compensation control value update amount control means are constituted by the functions of the controller 6.

In addition, in this embodiment, the distortion compensation control values are constituted by the control amounts at interpolation points, the correspondence between control amounts and signal power values is stored in the distortion compensation table 2, and the mode of distortion compensation by the attenuator 3 and phase shifter 4 is determined by the control amount, while the interpolation point update amount is equivalent to the number of corresponding pairs of control amounts and signal power values.

In addition, in this embodiment, the distortion compensation control value interpolation means is constituted by the functions of the controller 6.

In addition, in this embodiment, the correspondence between the interpolation point update amount and conditions pertaining to the distortion components (distortion amounts) is stored in the interpolation point update amount control table.

In addition, in this embodiment, the distortion compensation control value correspondence storage means is constituted by the functions of the distortion compensation table 2, the distortion-compensating distortion generation means is constituted by the functions of the attenuator 3 and functions of the phase shifter 4, while the distortion component detection means is constituted by the functions of the feedback controller 11, functions of the VCO 12, functions of the mixer 13 and functions of the BPF 14.

We shall now describe Embodiment 2-2.

In this embodiment, we shall describe a transmission power amplifier equipped with a predistorter that has the same configuration as that illustrated in FIG. 6 above and performs the same operation.

Here follows a description of examples of the configuration and operation regarding the control of the amount by which the control amounts are updated at interpolation points subject to updating in a single update.

This embodiment is described using an example of a controller C2 of the same constitution as that illustrated in FIG. 7 above, with only those portions that differ from the above described in detail.

The controller 27 of this embodiment consists of a quadrature demodulator 31, error detector 32 and a calculation block (interpolation point update amount calculation block) 33.

In this embodiment, the error detector 32 detects a signal consisting of the difference between the signal consisting of the I component and Q component input as the signal subject to amplification by the amplifier 26 and the signal consisting of the I component and Q component input from the quadrature demodulator 31 as the error (in this embodiment, the vector error) signal, and outputs this detected error signal to the interpolation point update amount calculation block 33. Here, as this error signal the amplified signal after the amplification process of the amplifier 26 may be detected as components shifted with respect to the signal before amplification, and the distortion components arising in the amplifier 26 or components proportional thereto may be detected.

The interpolation point update amount calculation block 33 calculates the interpolation point update amount based on the error signal input from the error detector 32 and exerts control over the interpolation point update amount.

Here the process by which the interpolation point number calculation block 33 controls the interpolation point update amount using this error signal as a feedback signal may be implemented in the same manner as the interpolation point update amount control process described in Embodiment 2-1 above.

Specifically, an interpolation point update amount control table like that illustrated in FIG. 12 above is stored in the memory of the interpolation point update amount calculation block 33 of this embodiment. In this embodiment, the "error signal" E is used instead of the "distortion amount" illustrated in FIG. 12 above, so the correspondence between the interpolation point update amount and the range of the error signal E is contained in the interpolation point update amount control table. Moreover, the greater the error signal E is the greater the interpolation point update amount A is controlled to be, while the smaller the error signal E is the smaller the interpolation point update amount A is controlled to be.

In addition, as an example of the procedure for the process of controlling the number of interpolation points performed by the controller 27 of this embodiment (i.e., process illustrated in FIG. 5) may be used. In this embodiment, use "error signal" instead of "distortion amount" in FIG. 5 above.

As described above, with a transmission power amplifier equipped with a predistorter according to this embodiment, in the predistorter P2 that does a lookup of the distortion compensation table 22 to perform distortion compensation on the amplifier 26, the output signal from the amplifier 26 subject to distortion compensation is fed back and the interpolation point update amount in the generation of the distortion compensation table 22 is adaptively controlled depending on this feedback signal and the error amount detected from the input signal to the predistorter P2. In the transmission power amplifier equipped with a predistorter according to this embodiment, control is exerted so that the interpolation point update amount is increased when the detected error amount is large and the interpolation point update amount is decreased when this error amount is small, and thus the interpolation point update amount is adaptively controlled by the interpolation method used to generate the distortion compensation table 22.

As a specific configuration, the transmission power amplifier equipped with a predistorter according to this embodiment comprises a signal level detection function 21 that detects the level of the signal subject to amplification by the amplifier 26, distortion compensation functions 22 and 23 that compensate for distortion contained in this signal based on the results detected by the signal level detection function 21, and a controller 27 that controls the interpolation point update amount based on the error amount in the results output from the amplifier 26 at the time that the distortion compensation functions 22 and 23 perform distortion compensation, and also updates the distortion compensation table 22 based on the results output from the amplifier 26 and the input signal to the predistorter P2, thereby compensating for distortion arising in the amplifier 26. In addition, in order to control the interpolation point update amount in the transmission power amplifier equipped with a predistorter according to this embodiment, a preset interpolation point update amount control table is used.

Accordingly, with a transmission power amplifier equipped with a predistorter according to this embodiment, the efficiency of the process of updating the distortion compensation table 22 can be improved by adaptively controlling the interpolation point update amount of the distortion compensation table 22 as described above. Specifically, it is possible to increase the speed of convergence of the distortion compensation table 22 over the overall update process, and it is possible to increase the accuracy of distortion compensation of the predistorter P2 as the convergence proceeds. To wit, in the process of updating the distortion compensation table 22 according to this embodiment, in the initial stages, the interpolation point update amount is large so the speed of convergence is increased, but as convergence proceeds, the interpolation point update amount decreases so the accuracy of distortion compensation can be increased, thereby achieving an extremely efficient distortion compensation process overall.

Note that in this embodiment, the amplifier 26 is equivalent to the amplifier subject to distortion compensation.

In addition, in this embodiment, the distortion compensator is constituted by the functions of the predistorter P2.

In addition, in this embodiment, the signal level detection means is constituted by the functions of the power detector 21, the distortion compensation execution means is constituted by the functions of the distortion compensation table 22 and functions of the vector processor 23, while the distortion compensation control value correspondence update means and distortion compensation control value update amount control means are constituted by the functions of the controller 27.

In addition, in this embodiment, the mode of distortion compensation by the vector processor 23 is determined by the control amount.

In addition, in this embodiment, the distortion compensation control value interpolation means is constituted by the functions of the controller 27.

In addition, in this embodiment, the correspondence between the interpolation point update amount and conditions pertaining to the distortion components is stored in the interpolation point update amount control table.

In addition, in this embodiment, the distortion compensation control value correspondence storage means is constituted by the functions of the distortion compensation table 22 and the distortion compensation generation means is constituted by the functions of the vector processor 23.

In addition, in this embodiment, the signal modulation means is constituted by the functions of the quadrature modulator 24, the signal demodulation means is constituted by the functions of the quadrature modulator 31, and the error detection means is constituted by the functions of the error detector 32.

We shall now describe Embodiment 2-3.

In this embodiment, we shall describe a transmission power amplifier equipped with a predistorter that has the same configuration as that illustrated in FIG. 8 above and performs the same operation.

We shall now describe in detail the process by which the controller 47 of this embodiment controls the amount by which the interpolation point update amount (attenuator control amount or phase shifter control amount) is updated (the interpolation point update amount) based on the elapsed time.

FIG. 14 is a diagram showing an example of a table used to control the interpolation point update amount (interpolation point update amount control table), where this interpolation point update amount control table is stored in the memory of the controller 47.

In the interpolation point update amount control table of this embodiment, the correspondence between the interpolation point update amount and the range of the time t from the start of convergence of the compensation table 42 is set in advance. Here, in this embodiment, the elapsed time from the point in time that the signal subject to amplification by the amplifier 45 is input to the predistorter P3 is used as this time t from the start of convergence.

This embodiment utilizes the property wherein the longer the elapsed time from the start of convergence typically the smaller the amount of distortion in the feedback as illustrated in Embodiment 2-1 above and the error signal in the feedback signal illustrated in Embodiment 2-2 above become.

Specifically, in this embodiment, taking N to be a number greater than or equal to 2, a group of threshold values is set up so that the relationships among the threshold values $T_{(N-1)}$ are as such: first threshold value $T_1$<second threshold value $T_2$< . . . <$(N-2)^{th}$ threshold value $T_{(N-2)}$<$(N-1)^{th}$ threshold value $T_{(N-1)}$. In addition, a group of interpolation point update amounts is set up so that the relationships among the interpolation point update amounts $A_{(N)}$ are as such: first interpolation point update amount $A_1$>second interpolation point update amount $A_2$> . . . >$(N-1)^{th}$ interpolation point update amount $A_{(N-1)}$>$N^{th}$ interpolation point update amount $A_{(N)}$.

Thus, in the interpolation point update amount control table of this embodiment, the interpolation point update amount $A_1$ corresponds to the case in which $0<t \leq T_1$, the interpolation point update amount $A_2$ corresponds to the case in which $T_1<t \leq T_2$, . . . the interpolation point update amount $A_{(N-1)}$ corresponds to the case in which $T_{(N-2)}<t \leq T_{(N-1)}$, while the interpolation point update amount $A_{(N)}$ corresponds to the case in which $T_{(N-1)}<t$. With this correspondence, the smaller the elapsed time t is the greater the interpolation point update amount A is controlled to be, while the greater the elapsed time t is the smaller the interpolation point update amount A is controlled to be.

Here follows a description of an example of the procedure for the process of controlling the interpolation point update amount performed by the controller 47 with reference to FIG. 10.

The controller 47 first detects the elapsed time t reported by the timer 46 (Step S11).

Next, the controller 47 sets the object of control (interpolation point update amount) to $A_1$ (Step S12), determines whether the elapsed time t is greater than the threshold value $T_1$ or not (Step S13). As a result, if the controller 47 determines that this elapsed time t is less than or equal to the threshold value $T_1$, the interpolation point update amount control process for this result of detection ends (Step S19).

On the other hand, if the controller 47 determines that the elapsed time t is greater than the threshold value $T_1$, it sets the interpolation point update amount to $A_2$ (Step S14) and also determines whether the elapsed time t is greater than the threshold value $T_2$ or not (Step S15). As a result, if the controller 47 determines that this elapsed time t is less than or equal to the threshold value $T_2$, the interpolation point update amount control process for this result of detection ends (Step S19). If this elapsed time t is determined to be greater than the threshold value $T_2$, then the same process is performed for the next threshold value $T_3$.

The controller 47 sequentially performs the same process for the subsequent threshold values. For example, if the controller 47 determines that the elapsed time t is greater than the threshold value $T_{(N-2)}$, it sets the interpolation point update amount to $A_{(N-1)}$ (Step S16) and also determines whether the elapsed time t is greater than the threshold value $T_{(N-1)}$ or not (Step S17). As a result, if the controller 47 determines that this elapsed time t is less than or equal to the threshold value $T_{(N-1)}$, the interpolation point update amount control process for this result of detection ends (Step S19).

On the other hand, if the controller 47 determines that the elapsed time t is greater than the threshold value $T_{(N-1)}$, it sets the interpolation point update amount to $A_{(N)}$ (Step S18) and the interpolation point update amount control process for this result of detection ends (Step S19).

In this manner, in the interpolation point update amount control process according to this embodiment, this process starts from a small interpolation point update amount and the interpolation point update amount increases with the elapsed time.

As described above, with a transmission power amplifier equipped with a predistorter according to this embodiment, in the predistorter P3 that does a lookup of the distortion compensation table 42 to perform distortion compensation on the amplifier 45, the interpolation point update amount in the generation of the distortion compensation table 2 is adaptively controlled depending on the elapsed time from the start of convergence of the compensation table 42. In the transmission power amplifier equipped with a predistorter according to this embodiment, control is exerted so that the interpolation point update amount is increased when the elapsed time is small and the interpolation point update amount is decreased when the elapsed time is large, and thus the interpolation point update amount is adaptively controlled by the interpolation method used to generate the distortion compensation table 42.

As a specific configuration, the transmission power amplifier equipped with a predistorter according to this embodiment comprises a signal level detection function 41 that detects the level of the signal subject to amplification by the amplifier 45, distortion compensation functions 42, 43 and 44 that compensate for distortion contained in this signal based on the results detected by the signal level detection function 41, a time measurement function 46 that measures the time elapsed in distortion compensation from the point in time that the signal subject to amplification by the amplifier 45 is input, and a controller 47 that controls the interpolation point update amount based on the distortion amount in the results output from the amplifier 45 at the time that the distortion compensation functions 42, 43 and 44 perform distortion compensation, and also updates the distortion compensation table 42 based on the results output from the amplifier 45 and the input signal to the predistorter P3, thereby compensating for distortion arising in the amplifier 45. In addition, in order to control the interpolation point update amount in the transmission power amplifier equipped with a predistorter according to this embodiment, a preset interpolation point update amount control table is used.

Accordingly, with a transmission power amplifier equipped with a predistorter according to this embodiment, the efficiency of the process of updating the distortion compensation table 42 can be improved by adaptively controlling the interpolation point update amount of the distortion compensation table 42 as described above. Specifically, it is possible to increase the speed of convergence of the distortion compensation table 42 over the overall update process, and it is possible to increase the accuracy of distortion compensation of the predistorter P3 as the convergence proceeds. To wit, in the process of updating the distortion compensation table 42 according to this embodiment, in the initial stages, the interpolation point update amount is large so the speed of convergence is increased, but as convergence proceeds, the interpolation point update amount decreases so the accuracy of distortion compensation can be increased, thereby achieving an extremely efficient distortion compensation process overall.

Note that in this embodiment, the distortion compensator is constituted by the functions of the predistorter P3.

In addition, the elapsed time measurement means is constituted by the functions of the timer 46.

In addition, in this embodiment, the correspondence between the interpolation point update amount and conditions related to elapsed time is stored in the distortion compensation table.

We shall now describe Embodiment 2-4.

In this embodiment, we shall describe a transmission power amplifier equipped with a predistorter that has the same configuration as that illustrated in FIG. 11 above and performs the same operation.

In this embodiment, the controller 58 calculates the interpolation point update amount based on the elapsed time reported from the timer 57 and thus controls the interpolation point update amount.

Here, the process by which the controller 58 controls the interpolation point update amount using this elapsed time may be implemented in the same manner as in the interpolation point update amount control process described in Embodiment 2-3 above.

Specifically, an interpolation point update amount control table like that illustrated in FIG. 14 above is stored in the memory of the controller 58 according to this embodiment.

In addition, as an example of the procedure for the process of controlling the interpolation point update amount performed by the controller 58 according to this embodiment, one like that illustrated in FIG. 10 above is used.

As described above, with a transmission power amplifier equipped with a predistorter according to this embodiment, in the same manner as described in Embodiment 2-3 above, in the predistorter P4 that does a lookup of the distortion compensation table 52 to perform distortion compensation on the amplifier 56, the interpolation point update amount in the distortion compensation table 52 is adaptively controlled, so the efficiency of the process of updating the distortion compensation table 52 can be improved by adaptively controlling the interpolation point update amount of the distortion compensation table 52 as described above.

Note that in this embodiment, the distortion compensator is constituted by the functions of the predistorter P4.

In addition, the elapsed time measurement means is constituted by the functions of the timer 57.

In addition, in this embodiment, the correspondence between the interpolation point update amount and conditions related to elapsed time is stored in the distortion compensation table.

As illustrated in Embodiments 2-1 through 2-4 above, with a transmission power amplifier equipped with a predistorter according to this embodiment, by controlling the amount by which the control values used to perform distortion compensation are updated (in this embodiment, the interpolation point update amount) at the time that this distortion compensation is performed with respect to distortion arising in an amplifier that amplifies a signal, it is possible to improve the efficiency of this compensation.

Here follows a description of Embodiment 3 of the present invention.

We shall first describe Embodiment 3-1.

In this embodiment, we shall describe a transmission power amplifier equipped with a predistorter that has the same configuration as that illustrated in FIG. 1 above and performs the same operation.

Note that in this embodiment, the number of interpolation points (interpolation point number) is constant, but a configuration in which the number of interpolation points is variable may also be used.

Here follows a description of examples of the configuration and operation regarding the control of the frequency at which the attenuator control amounts are updated at interpolation points. Note that in this embodiment, the attenuator control amounts and the phase shifter control amounts are updated at the same time, but a configuration wherein these are updated at different times may also be used.

This embodiment is described using an example of a controller C1 of the same constitution as that illustrated in FIG. 2 above, with only those portions that differ from the above described in detail.

The controller 6 of this embodiment consists of a feedback controller 11, voltage controlled oscillator (VCO) 12, mixer 13, bandpass filter (BPF) 14, frequency converter 15, analog-to-digital (A/D) converter 16 and a calculation block (interpolation point update frequency calculation block) 17.

In this embodiment, the A/D converter 16 converts the extracted results input from the frequency converter 15 from an analog signal to a digital signal which is output to the interpolation point update frequency calculation block 17. Here, the interpolation point update frequency calculation block 17 becomes information that indicates the amount of distortion generated in the amplifier 5 or an amount proportional thereto. Note that the amount of power may be used as the amount of distortion.

The interpolation point update frequency calculation block 17 calculates the interpolation point update frequency based on the digital signal input from the A/D converter 16 and exerts control over the interpolation point update frequency.

Here, we shall describe in detail the process by which the interpolation point update frequency calculation block 17 controls the interpolation point update frequency using the distortion power amount generated outside the band of the signal subject to amplification by the amplifier 5 as a feedback signal.

FIG. 15 is a diagram showing an example of a table used to control the interpolation point update frequency (interpolation point update frequency control table), where this interpolation point update frequency control table is stored in the memory of the interpolation point update frequency calculation block 17.

In the interpolation point update frequency control table of this embodiment, the correspondence between the range of the distortion amount E and the interpolation point update frequency is set in advance. Note that the notation "or error signal" in the interpolation point update frequency control table shown in FIG. 15 will be described in another embodiment to be described later, so it is not used in this embodiment.

Specifically, in this embodiment, taking N to be a number greater than or equal to 2, a group of threshold values is set up so that the relationships among the threshold values $Th_{(N-1)}$ are as such: first threshold value $Th_1$>second threshold value $Th_2$> . . . >$(N-2)^{th}$ threshold value $Th_{(N-2)}$>$(N-1)^{th}$ threshold value $Th_{(N-1)}$. In addition, a group of interpolation point update frequencies is set up so that the relationships among the interpolation point update frequencies $A_{(N)}$ are as such: first interpolation point update frequency $A_1$<interpolation point update frequency $A_2$< . . . $(N-1)^{th}$ interpolation point update frequency $A_{(N-1)}$>$N^{th}$ interpolation point update frequency $A_{(N)}$.

Thus in the interpolation point update frequency control table of this embodiment, the interpolation point update frequency $A_1$ corresponds to the case in which $Th_1$<E, the interpolation point update frequency $A_2$ corresponds to the case in which $Th_2$<E≦$Th_1$, . . . the interpolation point update frequency $A_{(N-1)}$ corresponds to the case in which $Th_{(N-1)}$<E≦$Th_{(N-2)}$ and the interpolation point update frequency $A_{(N)}$ corresponds to the case in which 0≦E≦$Th_{(N-1)}$. With this correspondence, the greater the distortion amount E is the greater the value that the interpolation point update frequency A (to wit, the higher the interpolation point update frequency A) is controlled to be, while the smaller the distortion amount E is the lesser the value the interpolation point update frequency A (to wit, the higher the interpolation point update frequency A) is controlled to be.

A graph similar to that shown in FIGS. 13(a) and (b) illustrates an example of a distortion compensation table. Note that the horizontal axis presents the power of the input signal subject to amplification by the amplifier 5, while the vertical axis presents the control amount. Here, the attenuator control amount or phase shifter control amount is used as the control amount in this embodiment.

In addition, the points indicated by black circles are equivalent to the interpolation points while the lines connecting the interpolation points are equivalent to the relationship of the control amount as a function of the input signal power obtained by interpolation.

FIG. 13(a) presents an example of a distortion compensation table in the case that the interpolation point update frequency is relatively high. This is equivalent to the situation in which the amount of distortion contained in the feedback signal from the amplifier 5 is relatively large being equivalent to a situation in the midst of the process of convergence.

On the other hand, FIG. 13(b) presents an example of a distortion compensation table in the case that the interpolation point update frequency is relatively low. This is equivalent to the situation in which the amount of distortion contained in the feedback signal from the amplifier 5 is relatively small being equivalent to a situation in which the convergence is optimized or nearly optimized.

The interpolation point update frequency calculation block 17 performs a lookup on the interpolation point update frequency control table presented in FIG. 15 above, and adaptively controls the interpolation point update frequency of distortion compensation table 2 depending on the magnitude of the distortion amount reported via A/D converter 16. At a stage such as that illustrated in FIG. 13(a) above, the interpolation point update frequency is high, so high-speed convergence can be expected. On the other hand, at a stage such as that illustrated in FIG. 13(b) above, the interpolation point update frequency is low so the power consumption can be lowered.

Here follows a description of an example of the procedure for the process of controlling the interpolation point update frequency performed by the controller 6 with reference to FIG. 5. Note that the notation "or error signal" in this figure will be described in another embodiment to be described later, so it is not used in this embodiment.

First of all, the controller 6 detects the distortion amount E (Step S1).

Next, the controller 6 sets the object of control (interpolation point update frequency) to $A_1$ (Step S2), determines whether the distortion amount E is greater than the threshold value $Th_1$ or not (Step S3). As a result, if the controller 6 determines that this distortion amount E is greater than the threshold value $Th_1$, the interpolation point update frequency control process for this result of detection ends (Step S9).

On the other hand, if the controller 6 determines that the distortion amount E is less than or equal to threshold value $Th_1$, it sets the interpolation point update frequency to $A_2$ (Step S4) and also determines whether the distortion amount E is greater than the threshold value $Th_2$ or not (Step S5). As a result, if the controller 6 determines that this distortion amount E is greater than the threshold value $Th_2$, the interpolation point update frequency control process for this result of detection ends (Step S9). If this distortion amount E is determined to be less than or equal to threshold value $Th_2$, then the same process is performed for the next threshold value $Th_3$.

The controller 6 sequentially performs the same process for the subsequent threshold values. For example, if the controller 6 determines that the distortion amount E is less than or equal to threshold value $Th_{(N-2)}$, it sets the interpolation point update frequency to $A_{(N-1)}$ (Step S6) and also determines whether the distortion amount E is greater than the threshold value $Th_{(N-1)}$ or not (Step S7). As a result, if the controller 6 determines that this distortion amount E is greater than the threshold value $Th_{(N-1)}$, the interpolation point update frequency control process for this result of detection ends (Step S9).

On the other hand, if the controller 6 determines that the distortion amount E is less than or equal to threshold value $Th_{(N-1)}$, it sets the interpolation point update frequency to $A_{(N)}$ (Step S8) and the interpolation point update frequency control process for this result of detection ends (Step S9).

As described above, with a transmission power amplifier equipped with a predistorter according to this embodiment, in the predistorter P1 that does a lookup of the distortion compensation table 2 to perform distortion compensation on the amplifier 5, the output signal from the amplifier 5 subject to distortion compensation is fed back and the interpolation point update frequency in the generation of the distortion compensation table 2 is adaptively controlled depending on the distortion amount detected from this feedback signal. In the transmission power amplifier equipped with a predistorter according to this embodiment, control is exerted so that the interpolation point update frequency is increased when the distortion amount in the feedback is large and the interpolation point update frequency is decreased when the distortion amount in the feedback is small, and thus the interpolation point update frequency is adaptively controlled by the interpolation method used to generate the distortion compensation table 2.

As a specific configuration, the transmission power amplifier equipped with a predistorter according to this embodiment comprises a signal level detection function 1 that detects the level of the signal subject to amplification by the amplifier 5, distortion compensation functions 2, 3 and 4 that compensate for distortion contained in this signal based on the results detected by the signal level detection function 1, and a controller 6 that controls the interpolation point update frequency based on the distortion amount in the results output from the amplifier 5 at the time that the distortion compensation functions 2, 3 and 4 perform distortion compensation, and also updates the distortion compensation table 2 based on the results output from the amplifier 5 and the input signal to the predistorter P1, thereby compensating for distortion arising in the amplifier 5. In addition, in order to control the interpolation point update frequency in the transmission power amplifier equipped with a predistorter according to this embodiment, a preset interpolation point update frequency control table is used.

Accordingly, with a transmission power amplifier equipped with a predistorter according to this embodiment, the efficiency of the process of updating the distortion compensation table 2 can be improved by adaptively controlling the interpolation point update frequency of the distortion compensation table 2 as described above. Specifically, it is possible to increase the speed of convergence of the distortion compensation table 2 over the overall update process, and it is possible to lower the power consumption in the updating process of the predistorter P1 as the convergence proceeds. To wit, in the process of updating the distortion compensation table 2 according to this embodiment, in the initial stages, the interpolation point update frequency is high, so the speed of convergence is increased, but as convergence proceeds, the interpolation point update frequency decreases so the power consumption can be lowered, thereby achieving an extremely efficient distortion compensation process overall.

Note that in this embodiment, the amplifier 5 is equivalent to the amplifier subject to distortion compensation.

In addition, in this embodiment, the distortion compensator is constituted by the functions of the predistorter P1.

In addition, the signal level detection means is constituted by the functions of the power detector 1, the distortion compensation execution means is constituted by the functions of the distortion compensation table 2, functions of the attenuator 3 and functions of the phase shifter 4, while the distortion compensation control value correspondence update means and distortion compensation control value update frequency control means are constituted by the functions of the controller 6.

In addition, in this embodiment, the distortion compensation control values are constituted by the control amounts at interpolation points, the correspondence between control amounts and signal power values is stored in the distortion compensation table 2, and the mode of distortion compensation by the attenuator 3 and phase shifter 4 is determined by the control amount, while the interpolation point update frequency is equivalent to the number of corresponding pairs of control amounts and signal power values.

In addition, in this embodiment, the distortion compensation control value interpolation means is constituted by the functions of the controller 6.

In addition, in this embodiment, the correspondence between the interpolation point update frequency and conditions pertaining to the distortion components (distortion amounts) is stored in the interpolation point update frequency control table.

In addition, in this embodiment, the distortion compensation control value correspondence storage means is constituted by the functions of the distortion compensation table 2, the distortion-compensating distortion generation means is constituted by the functions of the attenuator 3 and functions of the phase shifter 4, while the distortion component detection means is constituted by the functions of the feedback controller 11, functions of the VCO 12, functions of the mixer 13 and functions of the BPF 14.

We shall now describe Embodiment 3-2.

In this embodiment, we shall describe a transmission power amplifier equipped with a predistorter that has the same configuration as that illustrated in FIG. 6 above and performs the same operation.

Here follows a description of examples of the configuration and operation regarding the control of the frequency at which the control amounts are updated at interpolation points (the interpolation point update frequency).

This embodiment is described using an example of a controller C2 of the same constitution as that illustrated in FIG. 7 above, with only those portions that differ from the above described in detail.

The controller 27 of this embodiment consists of a quadrature demodulator 31, error detector 32 and a calculation block (interpolation point update frequency calculation block) 33.

In this embodiment, the error detector 32 detects a signal consisting of the difference between the signal consisting of the I component and Q component input as the signal subject to amplification by the amplifier 26 and the signal consisting of the I component and Q component input from the quadrature demodulator 31 as the error (in this embodiment, the vector error) signal, and outputs this detected error signal to the interpolation point update frequency calculation block 33. Here, as this error signal the amplified signal after the amplification process of the amplifier 26 may be detected as components shifted with respect to the signal before amplification, and the distortion components arising in the amplifier 26 or components proportional thereto may be detected.

The interpolation point update frequency calculation block 33 calculates the interpolation point update frequency based on the error signal input from the error detector 32 and exerts control over the interpolation point update frequency.

Here, the process by which the interpolation point number calculation block 33 controls the interpolation point update frequency using this error signal as a feedback signal may be implemented in the same manner as the interpolation point update frequency control process described in Embodiment 3-1 above.

Specifically, an interpolation point update frequency control table like that illustrated in FIG. 15 above is stored in the memory of the interpolation point update frequency calculation block 33 of this embodiment. In this embodiment, the "error signal" E is used instead of the "distortion amount" illustrated in FIG. 15 above, so the correspondence between the interpolation point update frequency and the range of the error signal E is contained in the interpolation point update frequency control table. Moreover, the greater the error signal E is the higher the interpolation point update frequency A is controlled to be, while the smaller the error signal E is the lower the interpolation point update frequency A is controlled to be.

In addition, as an example of the procedure for the process of controlling the number of interpolation points performed by the controller 27 of this embodiment one like that illustrated in FIG. 5 above may be used. In this embodiment, use "error signal" instead of "distortion amount" in FIG. 5 above.

As described above, with a transmission power amplifier equipped with a predistorter according to this embodiment, in the predistorter P2 that does a lookup of the distortion compensation table 22 to perform distortion compensation on the amplifier 26, the output signal from the amplifier 26 subject to distortion compensation is fed back and the interpolation point update frequency in the generation of the distortion compensation table 22 is adaptively controlled depending on this feedback signal and the error amount detected from the input signal to the predistorter P2. In the transmission power amplifier equipped with a predistorter according to this embodiment, control is exerted so that the interpolation point update frequency is increased when the detected error amount is large and the interpolation point update frequency is decreased when this error amount is small, and thus the interpolation point update frequency is adaptively controlled by the interpolation method used to generate the distortion compensation table 22.

As a specific configuration, the transmission power amplifier equipped with a predistorter according to this embodiment comprises a signal level detection function 21 that detects the level of the signal subject to amplification by the amplifier 26, distortion compensation functions 22 and 23 that compensate for distortion contained in this signal based on the results detected by the signal level detection function 21, and a controller 27 that controls the interpolation point update frequency based on the error amount in the results output from the amplifier 26 at the time that the distortion compensation functions 22 and 23 perform distortion compensation, and also updates the distortion compensation table 22 based on the results output from the amplifier 26 and the input signal to the predistorter P2, thereby compensating for distortion arising in the amplifier 26. In addition, in order to control the interpolation point update frequency in the transmission power amplifier equipped with a predistorter according to this embodiment, a preset interpolation point update frequency control table is used.

Accordingly, with a transmission power amplifier equipped with a predistorter according to this embodiment, the efficiency of the process of updating the distortion compensation table 22 can be improved by adaptively controlling the interpolation point update frequency of the distortion compensation table 22 as described above. Specifically, it is possible to increase the speed of convergence of the distortion compensation table 22 over the overall update process, and it is possible to lower the power consumption of the update process of the predistorter P2 as the convergence proceeds. To wit, in the process of updating the distortion compensation table 22 according to this embodiment, in the initial stages, the interpolation point update frequency is high, so the speed of convergence is increased. However, as convergence proceeds, the interpolation point update frequency decreases so the power consumption can be lowered, thereby achieving an extremely efficient distortion compensation process overall.

Note that in this embodiment, the amplifier 26 is equivalent to the amplifier subject to distortion compensation.

In addition, in this embodiment, the distortion compensator is constituted by the functions of the predistorter P2.

In addition, in this embodiment, the signal level detection means is constituted by the functions of the power detector 21, the distortion compensation execution means is constituted by the functions of the distortion compensation table 22 and functions of the vector processor 23, while the distortion compensation control value correspondence update means and distortion compensation control value update frequency control means are constituted by the functions of the controller 27.

In addition, in this embodiment, the mode of distortion compensation by the vector processor 23 is determined by the control amount.

In addition, in this embodiment, the distortion compensation control value interpolation means is constituted by the functions of the controller 27.

In addition, in this embodiment, the correspondence between the interpolation point update frequency and conditions pertaining to the distortion components is stored in the interpolation point update frequency control table.

In addition, in this embodiment, the distortion compensation control value correspondence storage means is constituted by the functions of the distortion compensation table 22 and the distortion compensation generation means is constituted by the functions of the vector processor 23.

In addition, in this embodiment, the signal modulation means is constituted by the functions of the quadrature modulator 24, the signal demodulation means is constituted by the functions of the quadrature modulator 31, and the error detection means is constituted by the functions of the error detector 32.

We shall now describe Embodiment 3-3.

In this embodiment, we shall describe a transmission power amplifier equipped with a predistorter that has the same configuration as that illustrated in FIG. 8 above and performs the same operation.

We shall now describe in detail the process by which the controller 47 of this embodiment controls the frequency at which the interpolation point update frequency (attenuator control amount or phase shifter control amount) is updated (the interpolation point update frequency) based on the elapsed time.

FIG. 16 is a diagram showing an example of a table used to control the interpolation point update frequency (interpolation point update frequency control table), where this interpolation point update frequency control table is stored in the memory of the controller 47.

In the interpolation point update frequency control table of this embodiment, the correspondence between the interpolation point update frequency and the range of the time t from the start of convergence of the compensation table 42 is set in advance. Here, in this embodiment, the elapsed time from the point in time that the signal subject to amplification by the amplifier 45 is input to the predistorter P3 is used as this time t from the start of convergence.

This embodiment utilizes the property wherein the longer the elapsed time from the start of convergence typically the smaller the amount of distortion in the feedback as illustrated in Embodiment 3-1 above and the error signal in the feedback signal illustrated in Embodiment 3-2 above become.

Specifically, in this embodiment, taking N to be a number greater than or equal to 2, a group of threshold values is set up so that the relationships among the threshold values $T_{(N-1)}$ are as such: first threshold value $T_1$<second threshold value $T_2$< . . . <$(N-2)^{th}$ threshold value $T_{(N-2)}$<$(N-1)^{th}$ threshold value $T_{(N-1)}$. In addition, a group of interpolation point update frequencies is set up so that the relationships among the interpolation point update frequencies $A_{(N)}$ are as such: first interpolation point update frequency $A_1$>second interpolation point update frequency $A_2$> . . . >$(N-1)^{th}$ interpolation point update frequency $A_{(N-1)}$>$N^{th}$ interpolation point update frequency $A_{(N)}$.

Thus in the interpolation point update frequency control table of this embodiment, the interpolation point update frequency $A_1$ corresponds to the case in which $0<t \leq T_1$, the interpolation point update frequency $A_2$ corresponds to the case in which $T_1<t \leq T_2$, . . . the interpolation point update frequency $A_{(N-1)}$ corresponds to the case in which $T_{(N-2)}<t \leq T_{(N-1)}$, while the interpolation point update frequency $A_{(N)}$ corresponds to the case in which $T_{(N-1)}<t$. With this correspondence, the smaller the elapsed time t is the greater the interpolation point update frequency A is controlled to be, while the greater the elapsed time t is the smaller the interpolation point update frequency A is controlled to be.

Here follows a description of an example of the procedure for the process of controlling the interpolation point update frequency performed by the controller 47 with reference to FIG. 10 above.

The controller 47 first detects the elapsed time t reported by the timer 46 (Step S11).

Next, the controller 47 sets the object of control (interpolation point update frequency) to $A_1$ (Step S12), determines whether the elapsed time t is greater than the threshold value $T_1$ or not (Step S13). As a result, if the controller 47 determines that this elapsed time t is less than or equal to the threshold value T1, the interpolation point update frequency control process for this result of detection ends (Step S19).

On the other hand, if the controller 47 determines that the elapsed time t is greater than the threshold value $T_1$, it sets the interpolation point update frequency to $A_2$ (Step S14) and also determines whether the elapsed time t is greater than the threshold value $T_2$ or not (Step S15). As a result, if the controller 47 determines that this elapsed time t is less than or equal to the threshold value $T_2$, the interpolation point update frequency control process for this result of detection ends (Step S19). If this elapsed time t is determined to be greater than the threshold value $T_2$, then the same process is performed for the next threshold value $T_3$.

The controller 47 sequentially performs the same process for the subsequent threshold values. For example, if the controller 47 determines that the elapsed time t is greater than the threshold value $T_{(N-2)}$, it sets the interpolation point update frequency to $A_{(N-1)}$ (Step S16) and also determines whether the elapsed time t is greater than the threshold value $T_{(N-1)}$ or not (Step S17). As a result, if the controller 47 determines that this elapsed time t is less than or equal to the threshold value $T_{(N-1)}$, the interpolation point update frequency control process for this result of detection ends (Step S19).

On the other hand, if the controller 47 determines that the elapsed time t is greater than the threshold value $T_{(N-1)}$, it sets the interpolation point update frequency to $A_{(N)}$ (Step S18) and the interpolation point update frequency control process for this result of detection ends (Step S19).

In this manner, in the interpolation point update frequency control process according to this embodiment, this process starts from a small interpolation point update frequency and the interpolation point update frequency increases with the elapsed time.

As described above, with a transmission power amplifier equipped with a predistorter according to this embodiment, in the predistorter P3 that does a lookup of the distortion compensation table 42 to perform distortion compensation on the amplifier 45, the interpolation point update frequency in the generation of the distortion compensation table 2 is adaptively controlled depending on the elapsed time from the start of convergence of the compensation table 42. In the transmission power amplifier equipped with a predistorter according to this embodiment, control is exerted so that the interpolation point update frequency is increased when the elapsed time is small and the interpolation point update frequency is decreased when the elapsed time is large, and thus the interpolation point update frequency is adaptively controlled by the interpolation method used to generate the distortion compensation table 42.

As a specific configuration, the transmission power amplifier equipped with a predistorter according to this embodiment comprises a signal level detection function 41 that detects the level of the signal subject to amplification by the amplifier 45, distortion compensation functions 42, 43 and 44 that compensate for distortion contained in this signal based on the results detected by the signal level detection function 41, a time measurement function 46 that measures the time elapsed in distortion compensation from the point in time that the signal subject to amplification by the amplifier 45 is input, and a controller 47 that controls the interpolation point update frequency based on the distortion amount in the results output from the amplifier 45 at the time that the distortion compensation functions 42, 43 and 44 perform distortion compensation, and also updates the distortion compensation table 42 based on the results output from the amplifier 45 and the input signal to the predistorter P3, thereby compensating for distortion arising in the amplifier 45. In addition, in order to control the interpolation point update frequency in the transmission power amplifier equipped with a predistorter according to this embodiment, a preset interpolation point update frequency control table is used.

Accordingly, with a transmission power amplifier equipped with a predistorter according to this embodiment, the efficiency of the process of updating the distortion compensation table 42 can be improved by adaptively controlling the interpolation point update frequency of the distortion compensation table 42 as described above. Specifically, it is possible to increase the speed of convergence of the distortion compensation table 42 over the overall update process, and it is possible to lower the power consumption involved in the update process of the predistorter P3 as the convergence proceeds. To wit, in the process of updating the distortion compensation table 42 according to this embodiment, in the initial stages, the interpolation point update frequency is low, so the speed of convergence is increased, but as convergence proceeds, the interpolation point update frequency increases so the power consumption can be lowered, thereby achieving an extremely efficient distortion compensation process overall.

Note that in this embodiment, the distortion compensator is constituted by the functions of the predistorter P3.

In addition, the elapsed time measurement means is constituted by the functions of the timer 46.

In addition, in this embodiment, the correspondence between the interpolation point update frequency and conditions related to elapsed time is stored in the distortion compensation table.

We shall now describe Embodiment 3-4.

In this embodiment, we shall describe a transmission power amplifier equipped with a predistorter that has the same configuration as that illustrated in FIG. 11 above and performs the same operation.

In this embodiment, the controller 58 calculates the interpolation point update frequency based on the elapsed time reported from the timer 57 and thus controls the interpolation point update frequency.

Here, the process by which the controller 58 controls the interpolation point update frequency using this elapsed time may be implemented in the same manner as in the interpolation point update frequency control process described in Embodiment 3-3 above.

Specifically, an interpolation point update frequency control table like that illustrated in FIG. 16 above is stored in the memory of the controller 58 according to this embodiment.

In addition, as an example of the procedure for the process of controlling the interpolation point update frequency performed by the controller 58 according to this embodiment, one like that illustrated in FIG. 10 above is used.

As described above, with a transmission power amplifier equipped with a predistorter according to this embodiment, in the same manner as described in Embodiment 3-3 above, in the predistorter P4 that does a lookup of the distortion compensation table 52 to perform distortion compensation on the amplifier 56, the interpolation point update frequency in the distortion compensation table 52 is adaptively controlled, so the efficiency of the process of updating the distortion compensation table 52 can be improved by adaptively controlling the interpolation point update frequency of the distortion compensation table 52 as described above.

Note that in this embodiment, the distortion compensator is constituted by the functions of the predistorter P4.

In addition, the elapsed time measurement means is constituted by the functions of the timer 57.

In addition, in this embodiment, the correspondence between the interpolation point update frequency and conditions related to elapsed time is stored in the distortion compensation table.

As illustrated in Embodiments 3-1 through 3-4 above, with a transmission power amplifier equipped with a predistorter according to this embodiment, by controlling the frequency at which the control values used to perform distortion compensation are updated (in this embodiment, the interpolation point update frequency) at the time that this distortion compensation is performed with respect to distortion arising in an amplifier that amplifies a signal, it is possible to improve the efficiency of distortion compensation.

Here, the constitution of the distortion compensator or the like according to the present invention is not necessarily limited to that presented above, but rather various constitutions may be used. Note that the present invention may also be provided as a method of executing the process according to the present invention, or as a computer program for implementing such a method.

In addition, the applicable fields of the present invention are not necessarily limited to those illustrated above, but rather the present invention may be applied to various fields.

In addition, it is possible to combine the constitutions of two or more among the first, second and third modes of the present invention.

In addition, the various processing performed in the distortion compensator or the like according to the present invention may be constituted by being implemented in hardware resources equipped with a processor and memory and the like being controlled by means of a processor executing a control program stored in read-only memory (ROM). In addition, the various functional means for executing this processing may also be constituted as independent hardware circuits.

In addition, the present invention may also be understood as one wherein the above control program (itself) is stored in a floppy disc®, CD-ROM or other computer-readable recording media, so that the processing according to the present invention can be implemented by loading said control program from the recording medium into a computer and executing the program by a processor.

As described above, with a distortion compensator according to the first mode of the present invention, by detecting the level of the signal amplified by the amplifier, executing distortion compensation on the signal amplified by the amplifier in a mode of distortion compensation corresponding to this detected signal level based on a correspondence between signal levels and distortion compensation control values that determine the distortion compensation mode, and updating the correspondence between signal levels and distortion compensation control values used in the execution of distortion compensation based on the signal amplified by the amplifier, at the time of compensating for distortion arising in the amplifier that amplifies the signal, the number of corresponding pairs of signal levels and distortion compensation control values in the updated correspondence between signal levels and distortion compensation control values is controlled, so it is possible to improve the efficiency of distortion compensation.

In addition, with a distortion compensator according to the second mode of the present invention, by detecting the level of the signal amplified by the amplifier, executing distortion compensation on the signal amplified by the amplifier in a mode of distortion compensation corresponding to this detected signal level based on a correspondence between signal levels and distortion compensation control values that determine the distortion compensation mode, and updating the correspondence between signal levels and distortion compensation control values used in the execution of distortion compensation based on the signal amplified by the amplifier, at the time of compensating for distortion arising in the amplifier that amplifies the signal, the amount by which the correspondence between signal levels and distortion compensation control values is updated is controlled, so it is possible to improve the efficiency of distortion compensation.

In addition, with a distortion compensator according to the third mode of the present invention, by detecting the level of the signal amplified by the amplifier, executing distortion compensation on the signal amplified by the amplifier in a mode of distortion compensation corresponding to this detected signal level based on a correspondence between signal levels and distortion compensation control values that determine the distortion compensation mode, and updating the correspondence between signal levels and distortion compensation control values used in the execution of distortion compensation based on the signal amplified by the amplifier, at the time of compensating for distortion arising in the amplifier that amplifies the signal, the frequency at which the correspondence between signal levels and distortion compensation control values is updated is controlled, so it is possible to improve the efficiency of distortion compensation.

What is claimed is:

1. A distortion compensator for compensating for distortion generated by an amplifier that amplifies a signal, said distortion compensator comprising:
    a signal level detector operable to detect a level of a signal to be amplified by the amplifier;
    a distortion compensation execution unit operable to execute distortion compensation on the signal to be amplified according to a mode of distortion compensation determined based on (i) the level of the signal to be amplified, and (ii) a correspondence between signal levels and distortion compensation control values as pairs;
    a distortion compensation control value correspondence updater operable to update the correspondence between the signal levels and the distortion compensation control values based on the signal amplified by the amplifier; and
    a distortion compensation control value number controller operable to control a number of the pairs of corresponding signal levels and distortion compensation control values,
    wherein said distortion compensation execution unit includes a distortion compensation control value interpolation unit operable to perform interpolation based on the correspondence between the signal levels and the distortion compensation control values, thereby determining the mode of distortion compensation corresponding to the level of the signal to be amplified.

2. A distortion compensator according to claim 1, wherein said distortion compensation control value number controller is operable to:
    increase the number of pairs of corresponding signal levels and distortion compensation control values according to a decrease in the distortion generated by the amplifier; and
    decrease the number of pairs of corresponding signal levels and distortion compensation control values according to an increase in the distortion generated by the amplifier.

3. A distortion compensator according to claim 2, wherein said distortion compensation control value number controller is operable to control the number of pairs of corresponding signal levels and distortion compensation control values based on a correspondence between (i) a number of distortion compensation control values, and (ii) stipulated conditions.

4. A distortion compensator according to claim 1, wherein said distortion compensation control value number controller includes an elapsed time measurement unit operable to:
    measure time elapsed during a processing of the signal amplified by the amplifier; and
    increase the number of pairs of corresponding signal levels and distortion compensation control values according to an increase in the measured time elapsed.

5. A distortion compensator according to claim 4, wherein said distortion compensation control value number controller is operable to control the number of pairs of corresponding signal levels and distortion compensation control values based on a correspondence between (i) a number of distortion compensation control values, and (ii) stipulated conditions.

6. A distortion compensator according to claim 1, further comprising an update amount controller operable to control an amount by which the correspondence between the signal levels and the distortion compensation control values is updated by said distortion compensation control value correspondence updater.

7. A distortion compensator for compensating for distortion generated by an amplifier that amplifies a signal, said distortion compensator comprising:
    a signal level detector operable to detect a level of a signal to be amplified by the amplifier;
    a distortion compensation execution unit operable to execute distortion compensation on the signal to be amplified according to a mode of distortion compensation determined based on (i) the level of the signal to be amplified, and (ii) a correspondence between signal levels and distortion compensation control values;
    a distortion compensation control value correspondence updater operable to update the correspondence between the signal levels and the distortion compensation control values based on the signal amplified by the amplifier; and an update amount controller operable to control an amount by which the correspondence between the signal levels and the distortion compensation control values is updated, wherein said update amount controller is operable to:

decrease the amount by which the correspondence between the signal levels and the distortion compensation control values is updated according to a decrease in the distortion generated by the amplifier; and increase the amount by which the correspondence between the signal levels and the distortion compensation control values is updated according to an increase in the distortion generated by the amplifier.

8. A distortion compensator according to claim 7, wherein said update amount controller is operable to control the amount by which the correspondence between the signal levels and the distortion compensation control values is updated based on a correspondence between (i) the amount determined by said update amount controller, and (ii) stipulated conditions.

9. A distortion compensator for compensating for distortion generated by an amplifier that amplifies a signal, said distortion compensator comprising:

a signal level detector operable to detect a level of a signal to be amplified by the amplifier;

a distortion compensation execution unit operable to execute distortion compensation on the signal to be amplified according to a mode of distortion compensation determined based on (i) the level of the signal to be amplified, and (ii) a correspondence between signal levels and distortion compensation control values;

a distortion compensation control value correspondence updater operable to update the correspondence between the signal levels and the distortion compensation control values based on the signal amplified by the amplifier; and an update amount controller operable to control an amount by which the correspondence between the signal levels and the distortion compensation control values is updated, wherein said update amount controller includes an elapsed time measurement unit operable to:

measure time elapsed during a processing of the signal amplified by the amplifier; and decrease the amount by which the correspondence between the signal levels and the distortion compensation control values is updated according to an increase in the measured elapsed time.

10. A distortion compensator according to claim 9, wherein said update amount controller is operable to control the amount by which the correspondence between the signal levels and the distortion compensation control values is updated based on a correspondence between (i) the amount determined by said update amount controller, and (ii) stipulated conditions.

11. A distortion compensator for compensating for distortion generated by an amplifier that amplifies a signal, said distortion compensator comprising:

a signal level detector operable to detect a level of a signal to be amplified by the amplifier;

a distortion compensation execution unit operable to execute distortion compensation on the signal to be amplified according to a mode of distortion compensation determined based on (i) the level of the signal to be amplified, and (ii) a correspondence between signal levels and distortion compensation control values;

a distortion component detector operable to detect distortion components, as the distortion, generated by the amplifier;

a distortion compensation control value correspondence updater operable to update the correspondence between the signal levels and the distortion compensation control values based on the distortion detected by said distortion component detector; and an update frequency controller operable to control a frequency at which the correspondence between the signal levels and the distortion compensation control values is updated by said distortion compensation control value correspondence updater, wherein said distortion compensation execution unit includes a distortion compensation table for storing the correspondence between the distortion compensation control values and the signal levels.

12. A distortion compensator according to claim 11, wherein said update frequency controller is operable to:

decrease the frequency at which the correspondence between the signal levels and the distortion compensation control values is updated according to a decrease in the distortion generated by the amplifier; and increase the frequency at which the correspondence between the signal levels and the distortion compensation control values is updated according to an increase in the distortion generated by the amplifier.

13. A distortion compensator according to claim 12, wherein said update frequency controller is operable to control the frequency at which the correspondence between the signal levels and the distortion compensation control values is updated based on a correspondence between (i) the frequency determined by said update frequency controller, and (ii) stipulated conditions.

14. A distortion compensator according to claim 11, wherein said update frequency controller includes an elapsed time measurement unit operable to:

measure time elapsed during a processing of the signal amplified by the amplifier; and decrease the frequency at which the correspondence between the signal levels and the distortion compensation control values is updated according to an increase in the measured time elapsed.

15. A distortion compensator according to claim 14, wherein said update frequency controller is operable to control the frequency at which the correspondence between the signal levels and the distortion compensation control values is updated based on a correspondence between (i) the frequency determined by said update frequency controller, and (ii) stipulated conditions.

16. A distortion compensator according to claim 11, wherein said distortion compensation execution unit further includes a distortion compensation control value interpolation unit operable to perform interpolation based on the correspondence between the signal levels and the distortion compensation control values, thereby determining the mode of distortion compensation corresponding to the level of the signal to be amplified.

* * * * *